US008217568B2

(12) United States Patent
Matsumura

(10) Patent No.: US 8,217,568 B2
(45) Date of Patent: Jul. 10, 2012

(54) LIGHT EMITTING ELEMENT AND LIGHT EMITTING DEVICE USING THE LIGHT EMITTING ELEMENT

(75) Inventor: Hiroaki Matsumura, Tokushima (JP)

(73) Assignee: Nichia Corporation, Anan-shi (JP)

( * ) Notice: Subject to any disclaimer, the term of this patent is extended or adjusted under 35 U.S.C. 154(b) by 6 days.

(21) Appl. No.: 12/680,178

(22) PCT Filed: Sep. 17, 2008

(86) PCT No.: PCT/JP2008/066710
§ 371 (c)(1),
(2), (4) Date: Apr. 22, 2010

(87) PCT Pub. No.: WO2009/041318
PCT Pub. Date: Apr. 2, 2009

(65) Prior Publication Data
US 2010/0201254 A1   Aug. 12, 2010

(30) Foreign Application Priority Data
Sep. 26, 2007   (JP) .................................. 2007/249865

(51) Int. Cl.
*H05B 33/02*   (2006.01)
(52) U.S. Cl. ...................................... 313/501
(58) Field of Classification Search .................. 313/504, 313/501
See application file for complete search history.

(56) References Cited

U.S. PATENT DOCUMENTS

| 5,048,035 A | 9/1991 | Sugawara et al. |
| 5,153,889 A | 10/1992 | Sugawara et al. |
| 2007/0221944 A1* | 9/2007 | Cheol Yoo ...................... 257/99 |

FOREIGN PATENT DOCUMENTS

| JP | 3-3373 A | 1/1991 |
| JP | 7-231116 A | 8/1995 |
| JP | 2000-164930 A | 6/2000 |
| JP | 2004-134549 A | 4/2004 |
| JP | 2005-123526 A | 5/2005 |
| JP | 2007-142474 A | 6/2007 |
| JP | 2007-207859 A | 8/2007 |

* cited by examiner

*Primary Examiner* — Toan Ton
*Assistant Examiner* — Hana Featherly
(74) *Attorney, Agent, or Firm* — Birch, Stewart, Kolasch & Birch, LLP

(57) ABSTRACT

The light emitting element includes a first electrode and a second electrode opposite each other and electrically connected respectively to a first conductive-type layer and a second conductive type layer constituting a semiconductor structure. The first electrode has a pair of electrode extending portions disposed opposite each other on an electrode forming surface over the first conductive-type layer which is positioned at the light extracting side. In the opposing direction of the pair of electrode extending portions, a half distance l1 between the electrode extending portions is smaller than the distance L2 from the electrode extending portions to an end edge of the electrode forming surface.

12 Claims, 11 Drawing Sheets

(a)

(b)

(c)

LIGHT EMITTING ELEMENT AND LIGHT EMITTING DEVICE USING THE LIGHT EMITTING ELEMENT

BACKGROUND OF THE INVENTION

1. Field of the Invention

The present invention relates to a structure of a semiconductor light emitting element, particularly, an element structure having electrodes arranged on the opposite sides of a semiconductor and interposing the semiconductor.

2. Description of the Related Art

There is disclosed (for example, in Patent Document 1) a technology in which, in a light emitting element having a p-type semiconductor layer and a n-type semiconductor layer stacked interposing a light emitting layer, an electrode extending portion extending from a connection portion with an external electrode is formed along a periphery of an electrode forming surface for spreading electric current supplied to the both semiconductor layers on the entire surface of the semiconductor surfaces.

As one example, in a light emitting element 100 shown in a plane view in FIG. 14, a p-type electrode pad portion 102 connected with a p-type semiconductor layer is arranged in a center portion of the element. Also, an n-type electrode pad portion 101 connected to an n-type semiconductor layer is formed in a corner of a rectangular-shaped electrode forming surface. An electrode extending portion 101a extended from the n-type electrode pad portion 101 forms a surrounding electrode 101b completely surrounding all four sides of the electrode forming surface. The surrounding substrate 101b allows reducing the average distance that the electric current needed to travel laterally in the n-type semiconductor layer and, as a result, the series resistance of the device can be reduced and therefore, uniformity of the electric current density can be improved.

In recent years, to comply with demand of further high output, the area of the electrode structure at the n-electrode side has been increased, and accordingly, the surrounding electrode region has been increased, by disposing the surrounding electrode very closely to the edge of the element, in other words, by disposing the surrounding electrode without any space left between the surrounding electrode and the outer circumference of the element. In addition, a structure aiming to improve the uniformity of emission has been developed, in which the region surrounded by the electrode extending portion is further divided into a plurality of small regions by the electrode extending portion to uniformly spread the current in each region.

For example, in the light emitting element 200 shown in the plane view of FIG. 15, the electrode pad portion 201 is formed at a corner of the rectangular electrode forming surface. Further, the electrode extending portion 201a extended from the electrode pad portion 201 forms a surrounding electrode 201b encircling the circumference of the electrode forming surface. In addition, a plurality of the electrode extending portions 201a are evenly branched out from the orthogonally crossing two sides which form a corner portion of the electrode pad portion 201, and are respectively perpendicularly bent to divide the area within the surrounding electrode 201b into a plurality of compartments 203. In the example shown in FIG. 15, the plurality of compartment regions have a generally L-shaped configuration with different sizes which increase with the distance from the electrode pad portion 201, while the width of each of the regions is substantially the same. With this structure, the differences in local current density at the portions in the electrode forming surface can be reduced, that is, dispersion of the current is facilitated, so that the current density in the electrode forming surface is expected to be further uniform.

Patent Document 1: JP 2000-164930A

SUMMARY OF THE INVENTION

However, the present inventor discovered that the electric current crowds at the bent portions of the electrode extending portions which may result in locally uneven distribution of electric current. Uneven distribution of electric current is a contributing factor in the generation of excessive heat and the accumulation of heat in the element, and it also results in a decrease in the carrier injection efficiency to the element, and thus causes a deterioration of quantum efficiency. Further discovered is that due to the length of the surrounding electrode and the light blocking in the region, the output rather decreases with a conventional surrounding electrode structure disposed at a peripheral portion.

In addition, in a case of large current operation with increased electric power aiming a high output, the problems described above will increasingly occur. In addition, when the heat dissipation is insufficient, the atmospheric temperature in the element rises and which may cause the alloy composition in the external connection regions to change. As a result, resistance may be increased and deterioration of the emission intensity and the element itself may occur.

The present invention is devised to solve the problems described above. A main object of the present invention is to provide a light emitting element having a structure capable of obtaining uniform local electric current with excellent heat dissipation, and further, capable of emitting light with high efficiency even at a large electric current operation while attaining long operation life and high reliability, and to provide a light emitting device using the light emitting element.

To attain the object described above, a light emitting element of a first aspect of the invention includes a semiconductor structure 10 having a first conductive type layer 11 and a second conductive type layer 12 stacked interposing a light emitting layer 13, a first electrode 21 and a second electrode 21 respectively electrically connected to the first conductive type layer 11 and the second conductive type layer 12 which are arranged opposite each other. The first electrode 21 has a pair of electrode extending portions 30 opposite each other and formed on an electrode forming surface 15 on the first conductive type layer 11 positioned at the light extracting side. In the first electrode 21, in the opposing direction of the pair of electrode extending portions 30, the half distance I1 between the electrode extending portions 30 is shorter than the distance L2 from the electrode extending portions 30 to the end edge of the electrode forming surface 15.

A light emitting element of a second aspect of the invention includes a semiconductor structure 10 having a first conductive type layer 11 and a second conductive type layer 12 stacked interposing a light emitting layer 13 between them, and a first electrode 21 and a second electrode 21 which are arranged opposite each other and are respectively electrically connected to the first conductive type layer 11 and the second conductive type layer 12. The first electrode 21 has a pair of electrode extending portions 30 formed on the electrode forming surface 15 on the first conductive type layer 11 positioned at the light extraction side. The electrode forming surface 15 has a first region 31 arranged at substantially the center portion of the electrode forming surface 15 and interposed between the electrode extending portions 30, and a second region 32 positioned between the outer periphery of the first region 31 and the end edge of the electrode forming surface 15. In the opposing direction of the pair of electrode extending portions 30, the center of the width between the center of the first region 31 and the end edge of the electrode forming surface 15 is positioned in the second region.

Further, in a light emitting element of a third aspect of the invention, in the opposing direction of a pair of electrode extending portions 30, the distance L2 from an electrode extending portion 30 to an end edge of the electrode forming surface 15 is 1.2 times or more and 1.5 times or less than the half distance I1 between the pair of the electrode extending portions 30.

In a light emitting element of a fourth aspect of the invention, in plan view from the light extracting side, the electrode extending portions 30 are arranged substantially symmetrical with respect to the center of the electrode forming surface 15.

In a light emitting element of a fifth aspect of the invention, in plan view from the light extracting side, the electrode extending portions 30 are in linear shape.

In a light emitting element of a sixth aspect of the invention, the first region 31 interposed between the electrode extending portions 30 has an opening in the extending direction of the electrode extending portions 30.

In a light emitting element of a seventh aspect of the invention, a pair of electrode extending portions 30 respectively has an external connection region 16 electrically connectable with an external electrode on a part of the electrode extending portions 30. The pair of external connection region 16 are arranged offset relative to each other in a longer direction and/or a shorter direction of the electrode forming surface 15.

In a light emitting element of a eighth aspect of the invention, in a plan view from the light extracting side, the first electrode 21 and the second electrode 21 are arranged offset relative to each other, and the second electrode 21 is formed in the second region 32 positioned between the electrode extending portion 30 of the first electrode 21 and the end edge of the electrode forming surface 15.

In a light emitting element of a ninth aspect of the invention, the second regions 32 surrounding the first region respectively have a second right and left region arranged at the both end regions in the extending direction of the electrode extending portion 30 and a second upper and lower region arranged at the both end regions in the opposing direction of the electrode extending portion 30. The width L3 of the second right and left regions are 0.2 times or more and 0.8 times or less of the width L4 of the second upper and lower regions.

A light emitting device of a tenth aspect of the invention includes a base 14 having a first electrode pattern and a second electrode pattern and a single or plurality of light emitting elements 1 mounted on the base 14 and respectively electrically connected to the first electrode pattern and the second electrode pattern, in which the light emitting elements 1 are as described in one of Claims 1 to 9 and are covered with an element covering member 26.

A light emitting device of a eleventh aspect of the invention includes, in an element covering member 26, a wavelength converting member 9, which is capable of absorbing at least a part of emission from the light emitting elements 1 and converting the wavelength of the absorbed light, and/or a light diffusing member capable of reflecting emission from the light emitting elements 1.

According to a light emitting element of the present invention, in the electrode forming surface of the first electrode, a pair of the electrode extending portions which are spaced apart each other are arranged near the center so that the outside region of the electrode extending portions can be made relatively wide. Heat generated near the electrodes in the elements and in the narrow parts in the pair of electrode extending portions is transferred to the outside region of the electrode extending portions and released. That is, a wide heat releasing region can be allocated, so that heat accumulation in the elements can be reduced and the light emitting elements excellent in heat releasing property can be obtained.

According to the present invention, a light emitting device excellent in heat dissipation and has high reliability even under large current operation can be obtained. Further, mixing a wavelength converting member or light diffusing member in the element covering member allows changing the wavelength of the emission from the light source in addition to reflecting or scattering light, so that a light emitting device having high output power in a predetermined color region can be obtained. Moreover, if a light source having predetermined peak wavelength is selectively mounted, a light emitting device capable of emitting light of desired color with high efficiency can be obtained, and the range of possible emission wavelengths can be increased.

BRIEF DESCRIPTION OF DRAWINGS

FIGS. 13(a) to (c) are distribution diagrams showing relative emission intensity of light emitting elements, in which FIG. 13(a) is a diagram obtained with a light emitting element of Example 1, FIG. 13(b) is a diagram obtained with a light emitting element of Comparative Example 1, and FIG. 13(c) is a diagram obtained with a light emitting element of Comparative Example 2, respectively.

DETAILED DESCRIPTION OF THE EMBODIMENT(S)

Figure 1:
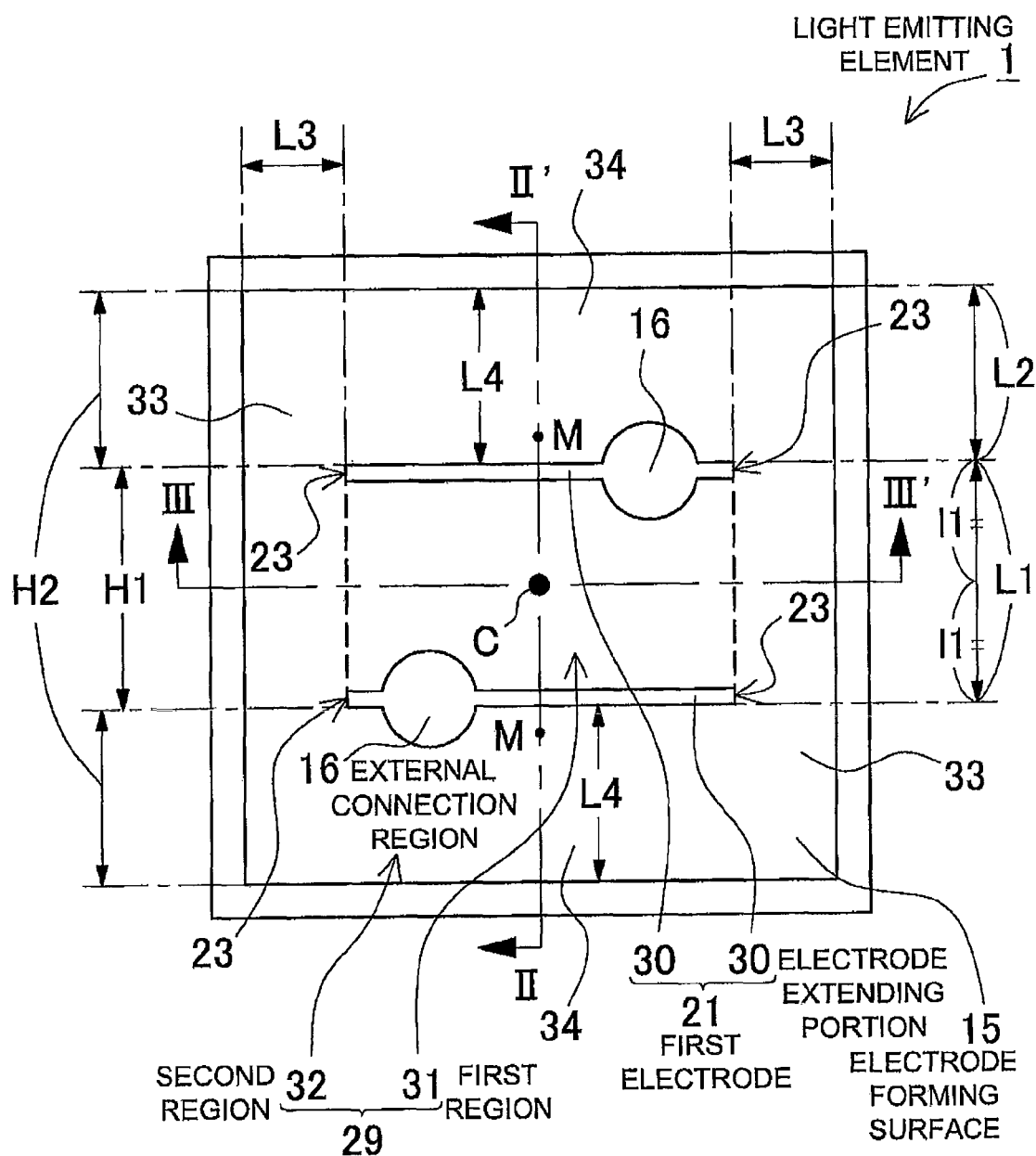
FIG. 1 is a plan view of a light emitting element according to an embodiment.

Hereinafter, examples of the present invention will be described with reference to the accompanying drawings.

However, the examples described below are illustrative of a light emitting element and a light emitting device to give a concrete form to technical ideas of the invention, and the light emitting elements and the light emitting devices are not specifically limited to description below. Further, the numbers corresponding to the members shown in examples are also given to the members described in "claims" and in "means to solve the problems" to help understanding of the scope of the invention. Further, the members shown in claims attached hereto are not specifically limited to members in the examples. Particularly, the sizes, materials, shapes and the arrangement relationships of the members described in examples are given as an example and not as a limitation to the scope of the invention.

The sizes and the positional relationships of the members in each of drawings are occasionally shown exaggerated for ease of explanation. In the description below, the same designations or the same reference numerals denote the same or like members and duplicative descriptions will be appropriately omitted. In addition, a plurality of structural elements of the present invention may be configured as a single part which serves the purpose of a plurality of elements, on the other hand, a single structural element may be configured as a plurality of parts which serve the purpose of a single element. In the present specification, the term "on" used in expression such as "on a layer" includes in its meaning not only "formed in contact with an upper surface" but also "formed spaced apart above an upper surface, and is used including the cases where there is an intervening layer between the layers.

EMBODIMENTS

Figure 2:
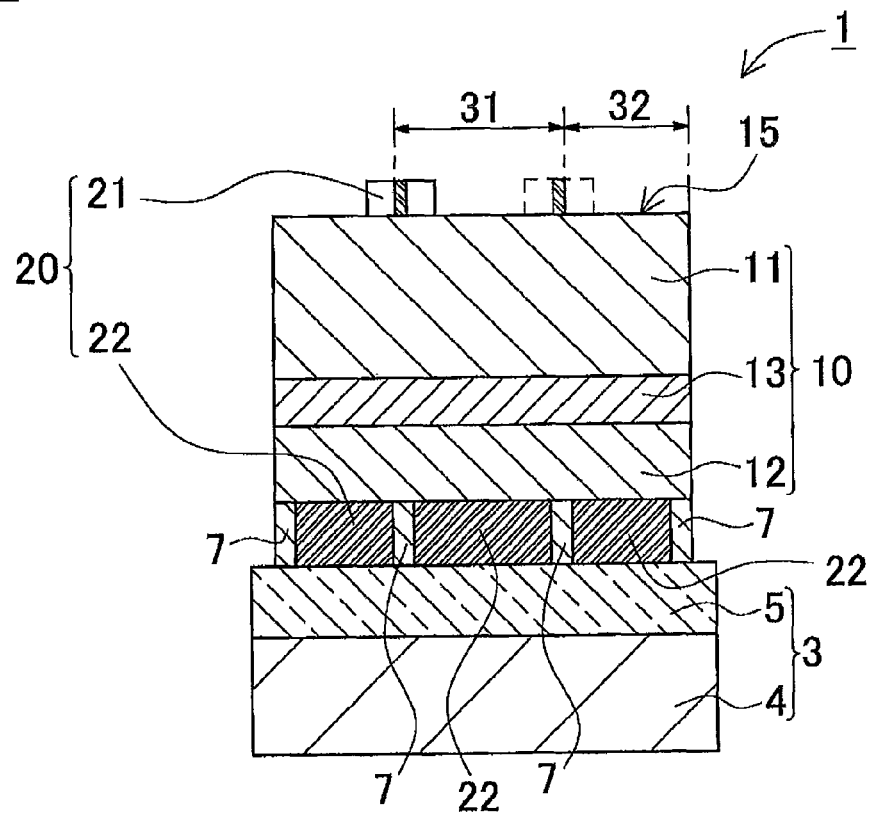
FIG. 2 is a schematic cross-sectional view taken along line II-II' of FIG. 1.

A plan view shown in FIG. 1 is an example of a light emitting element 1 according to the present embodiment. FIG. 2 is a cross sectional view taken along line II-II' of FIG. 1, and FIG. 3 is a cross sectional view taken along line III-III' of FIG. 1, respectively.

Figure 3:
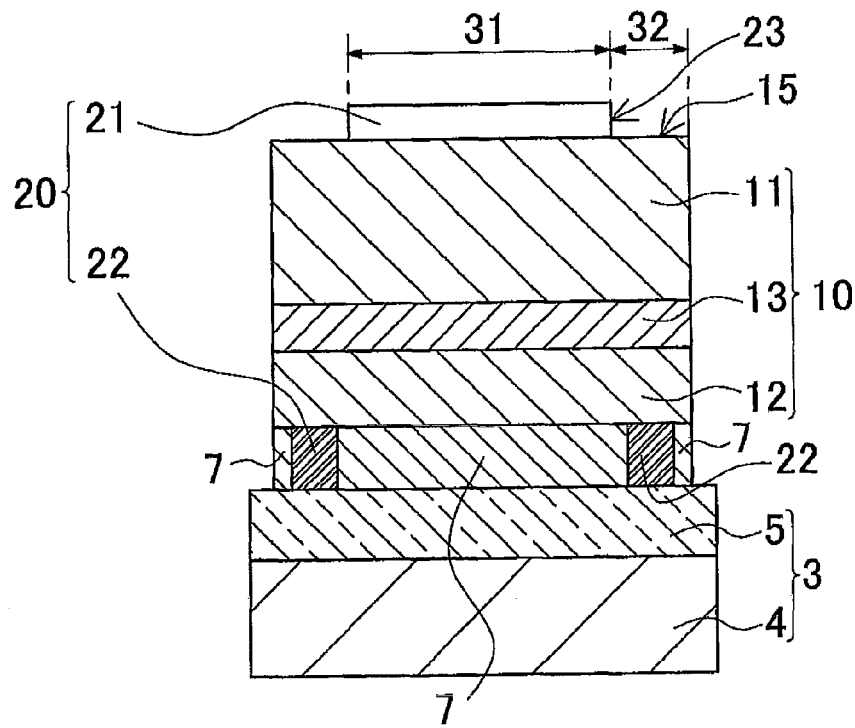
FIG. 3 is a schematic cross-sectional view taken along line III-III' of FIG. 1.

The light emitting element 1 shown in FIG. 2 or FIG. 3 is mainly constructed of a support pedestal 3, a semiconductor structure 10 positioned above the support pedestal 3, an electrode portion 20 interposing upper and lower surfaces of the semiconductor structure 10. Also, the support pedestal 3 is fixed by a support substrate 4 and a bonding layer 5 stacked in this order. The semiconductor structure 10 includes a light emitting layer 13, a n-type semiconductor layer which is a first conductive type layer 11 stacked interposing the light emitting layer 13, and a p-type semiconductor layer which is a second conductive type layer 12. In the example shown in the figures, the p-type semiconductor layer 12, the light emitting layer 13, and the n-type semiconductor layer 11 are stacked in this order to form the semiconductor structure 10, and the n-type semiconductor layer 11 side which is positioned in upper side of the semiconductor structure 10 is the main light emitting surface side, that is the light extracting side, of the emission from the light emitting layer 13.

(Electrode)

The electrode 20 includes a first electrode 21 and a second electrode 22 respectively supply electric power to the n-type semiconductor layer 11 and the p-type semiconductor layer 12. Specifically, an n-type electrode which is the first electrode 21 is formed on the n-type semiconductor layer 11 so that electric power can be supplied. Similarly, the second electrode 22 is formed on a part of the main surface of the p-type semiconductor layer 12.

FIG. 1 is a plan view of the light emitting element 1 seen from the light extracting side, where a configuration of the n-type electrode 21 on the n-type semiconductor layer 11 is mainly illustrated. As shown in FIG. 1, the n-type electrode 21 is constructed of a pair of linear-shaped electrode extending portions 30 formed on the substantially in the center portion of the square-shaped electrode forming surface 15, and does not include a surrounding electrode structure which encircles the periphery of the electrode forming surface 15 along the end-edge shape thereof. Here, the shape of the electrode forming surface 15 is not limited to a square shape and a regular polygonal shape, a rectangular shape such as a parallelogram shape, a polygonal shape, a circular shape and the like can also be employed, and is also adjusted according to the shape of the exposed region of the n-type semiconductor layer 11.

The electrode extending portions 30 shown in FIG. 1 are arranged substantially symmetrical about the center C point and are spaced apart each other in the center portion of the electrode forming surface 15. Further, in plan view from the light extracting side, the electrode extending portion 30 has a linear shape with no branches and is formed in a continuous thin line. Moreover, a pair of opposing electrode extending portions 30 do not intersect each other, and in the example shown in FIG. 1, the linear electrode extending portions 30 are extended substantially in parallel with each other at substantially the same separation distance. As described above, by symmetrically arranging the regions to which external current is supplied, the current can be distributed with high efficiency to the entire surface of the electrode forming surface 15. Moreover, by employing a structure in which the electrode extending portions 30 are spaced apart from each other and which have a linear shape without an intersection or a branch, the electric current can be prevented from crowding and uniformity of the electric current density can be improved.

Also, the electrode forming surface 15 has a light emitting region 29 divided into a first region and a second region. Specifically, as shown in the auxiliary dashed lines in FIG. 1, the region between the opposing pair of electrode extending portions 30 is referred to as a first region 31, and further, the region which is the four peripheries of the first region 31, that is, the region positioned between the outer edge of the first region 31 and the end edges of the four sides of the electrode forming surface 15 is referred to a second region 32. In other words, the position for forming the electrode extending portions 30 defines the boundary between the first region 31 and the second region 32, and further defines the proportion of the two regions. A suitable position for forming the electrode extending portions 30 will be described below.

The electrode extending portions 30 are so arranged that in the opposing direction of the pair of the electrode extending portions 30, the middle point M between the center C and end edge of the electrode forming surface 15 is positioned in the second region. In other words, in the opposing direction of the electrode extending portion 30, the center of the width between the center of the first region 31 and the end edge of the electrode forming surface 15 is positioned in the second region 32. In this configuration, the n-type electrode 21 of the light emitting element 1 is such that in the opposing direction of the electrode extending portions 30, the half distance l1 of the distance L1 between the electrode extending portions 30 is smaller than the distance L2 from the electrode extending portion 30 to the end edge of the electrode forming surface 15. With this, electric injection and diffusion, and heat dissipation that will be described later can be enhanced. Further, in an element in which the electrode extending portions are formed line-symmetrically with respect to the line passing through the center of the width, the width H1 of the first region 31 is smaller than the total width H2 of the second region located upper and lower sides of the first region. That is, the electrode extending portions 30 are arranged closer to the center. Further specifically, in the opposing direction of the electrode extending portions 30, the distance L2 from the electrode extending portion 30 to the end edge of the electrode forming surface 15 is preferably 1.2 times or more and 1.5 times or less than the half distance I1 between the pair of the electrode extending portions 30. In this range, heat dissipation of the element can be improved while preventing an excessive rise in temperature in the first region due to the heat generated by a closely arranged pair of electrode extending portions. Accordingly, there can be obtained an element capable of emitting light with high efficiency even at a large current operation and of providing long operation life with high reliability.

In addition, in the light emitting element 1 shown in FIG. 1, the second region 32 surrounds four sides of the first region. The second region 32 includes the second right and left portions 33 arranged at the both end regions in the right and left direction in FIG. 1, and the second upper and lower portions 34 arranged at the both end regions in the opposing direction (the upper and lower direction in FIG. 1) of the electrode extending portions 30, respectively. The width L3 of the second right and left portions 33 substantially corresponds to the distance from the end edges 23 of the electrode extending portions 30 to the end edge of the electrode forming surface 15. In other words, the width L3 of the second right and left regions 33 depends on the degree of extension of the electrode extending portions 30. The electrode extending portions 30 are preferably so arranged that the width L3 of each second right and left portion is 0.2 or more and 0.8 or less than the width L4 of each second upper and lower portion. This is because within this range, the area ratio of the electrode extending portions 30 in the electrode forming surface 15 can be increased without forming an intersecting portion in the n-type electrode 21. With this configuration, localizing of the electric current can be avoided and in-plane diffusion of the electric current can be facilitated, and further, reduction of the light emitting region can be prevented or the light emitting region can be increased, thus, high output power can be achieved.

Further, with the electrode arrangement that satisfies the range described above, in plan view from the electrode forming surface 15, the heat generated in the first region 31 can be transferred to the second region positioned at the four sides thereof in a two dimensional manner, so that heat dissipation effect with high efficiency can be achieved. Moreover, a structure can be employed in which the end edges 23 of the electrode extending portion 30 are positioned at the border between the first region 31 and the second right and left regions 23 and spaced apart from the end edges of the electrode extending surface 15. That is, the first region 31 arranged between the opposing pair of electrode extending portions 30 forms an opening in the extending direction of the electrode extending portions 30. As described above, by arranging a part of the electrodes spaced apart, preferably, without forming an intersection and/or a bent portion, further preferably arranging them spaced apart from each other, localization of the electric current and/or heat generation at the connecting portion and/or each intersection and/or bent portion can be prevented, so that the electric current injection and heat dissipation in the first and second regions can be suitably enhanced.

With the structure described above, an excessive rise in temperature and heat accumulation can be prevented in the first region 31 which occurs when the electrode extending portions 30 are arranged too close to each other, and at the same time, the heat generated in the vicinity of the electrode extending portions 30 and in the first region 31 can be dissipated effectively in the wide adjacent heat dissipation region, that is, in the second region 32 and/or in the vicinity of the opening of the electrode extending portions 30. As a result, obtained is a light emitting element with high reliability even under a large current operation.

Figure 4:
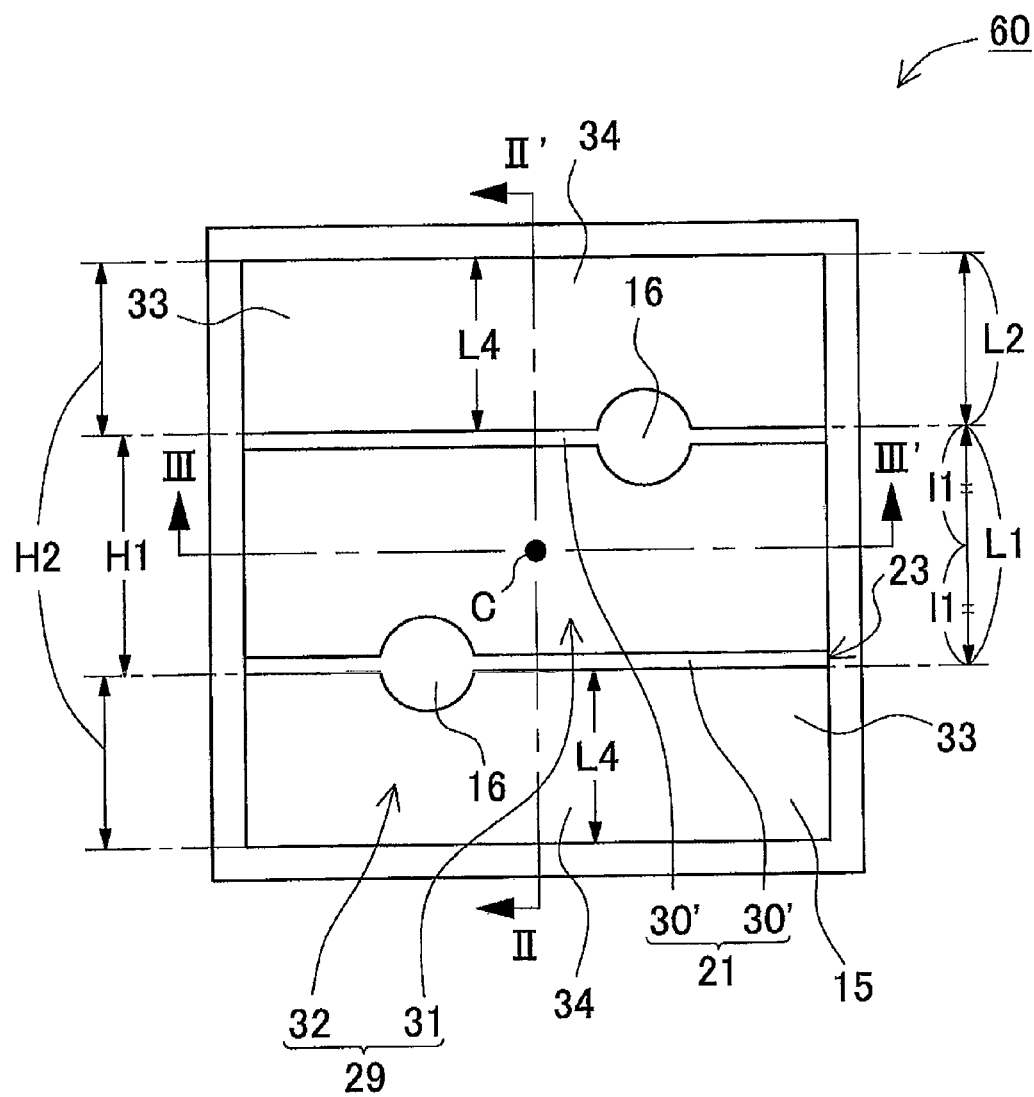
FIG. 4 is a plan view of a light emitting element according to another embodiment.

Moreover, the degree of extension of the electrode extending portions 30 is not limited in the range described above, and as shown in FIG. 4, the electrode extending portion 30' may be provided with a length corresponding to a side of the semiconductor structure, that is a side of the electrode forming surface 15. With the electrode arrangement in which the electrodes are extended to leach the end edges as described above, in the light emitting element 60, the first region 31 interposed between a pair of electrode extending portions 30' is arranged such that the longitudinal end edges thereof are substantially at the same position as the end edges of the electrode forming surface 15. That is, the longitudinal width of the first region 31 corresponds substantially to a side of the electrode forming surface 15. As a result, without having an intersection, the area ratio of the electrode extending portions 30' with respect to the electrode forming surface 15 can be further increased, so that the electric current can be injected while preventing localization of the current, and thus the light emitting efficiency can be improved.

Further, heat generation in the first region 31 can be transferred to the second regions 32 interposing the first region 31 in substantially perpendicular direction with respect to the extending direction of the electrode extending portions 30', and the heat can be dissipated in the second regions having a wide heat dissipating area. Thus, heat accumulation in the entire element can be prevented. Further, the first region 31 has an opening in the extending direction of the electrode extending portions 30', so that the heat dissipating effect can further be enhanced. Herein, the light emitting element 60 shown in FIG. 4 has a substantially the same structure compared with that of the light emitting element 1 shown in FIG. 1, except the structure of the electrode extending portions, and thus, the same reference numerals are attached thereto and their detailed description will be omitted.

Figure 11:
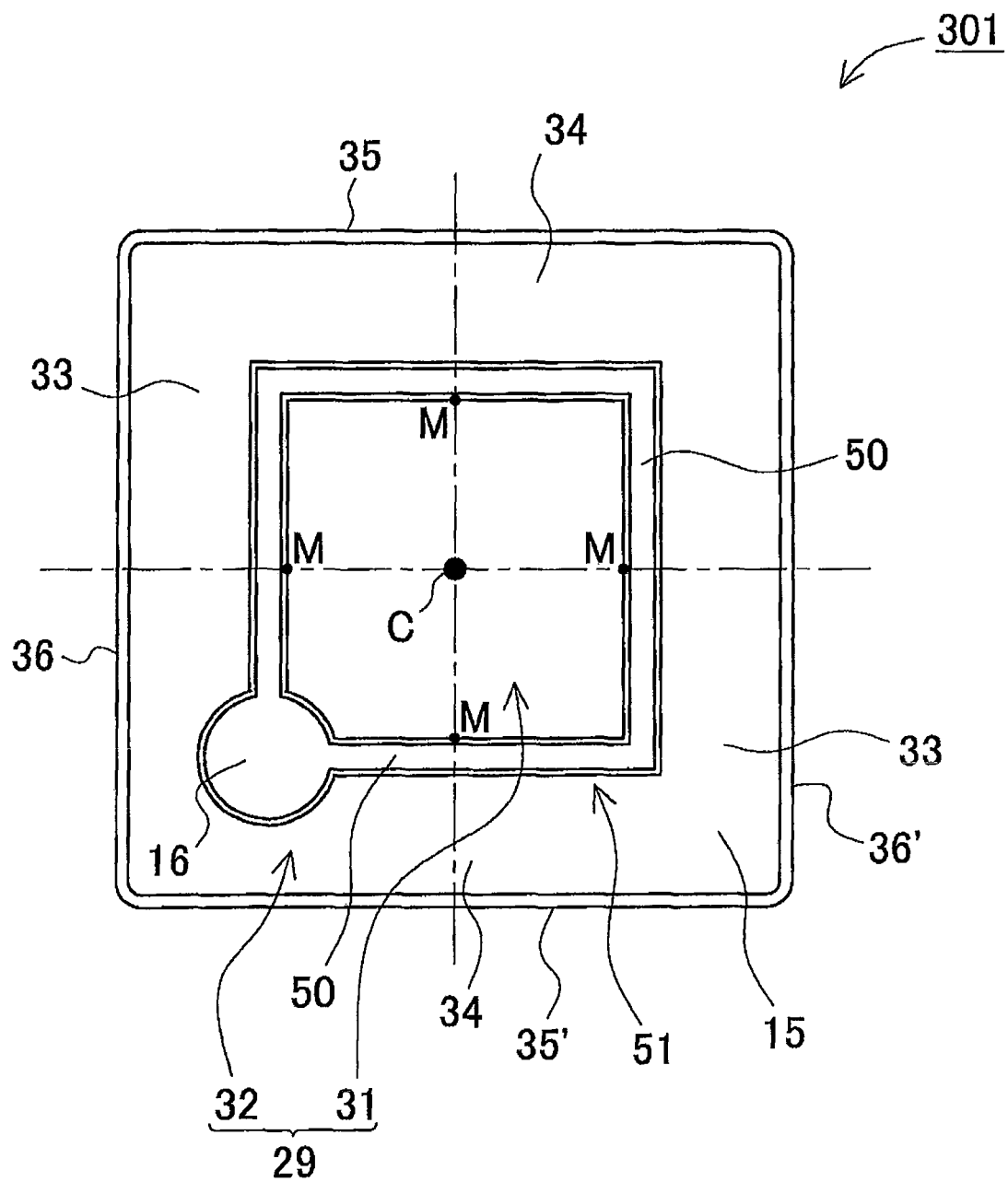
FIG. 11 is a plan view of a light emitting element according to Comparative Example 1.

Thus, an altered structure may be employed in the width-based structure as described above, such as, a structure having the width-based structure in a part thereof, and preferably a structure expanding the width-based structure. For example, in the structure shown in FIG. 4, the width-based structure is employed at the both sides of the theoretical line which passes through the center C and divides the area in half. Other structures such as a structure in which the width-based structure is rotated around the center C, for example as shown in FIG. 11, a structure having four-times rotational symmetry can be employed. As described above, the functions obtained by the present invention can be achieved by expanding the above described width-based structure in a part, and the functions can be enhanced by applying the structure in a wider area in an entire element. The above-described width-based structure is preferably ¼ or more, further preferably more than ⅓, and suitably more than ½. Also, in the example shown in FIG. 1, the structure is expanded in a similar way as in FIG. 4. Although neither of them has the above-described width-based structure in the electrode extending direction, the example shown in FIG. 1 has a structure closer to the width-based structure and therefore is more functionally advantageous. Thus, in the above-described partially width-based structure, the rest of the region other than the partially width-based structure preferably has a structure closer to the width-based structure described above. In this specification, an element having a rectangular shape is illustrated, but various shapes can be similarly employed such as an substantially polygonal shape such as an substantially hexagonal shape, an substantially circular shape, and substantially oval shape.

(Offset Arrangement)

The n-type electrode 21 and the p-type electrode 22 are arranged in an offset manner in the stacking direction of the semiconductor structure 10 and the direction perpendicular to the stacking direction. An offset arrangement refers, specifically, to an arrangement in which an opposing surface of each electrode is exposed at the opposing surface side of the electrode. However, the offset arrangement is not limited thereto and in a plan view, a part of the first and second electrodes may overlap with each other, it is preferable that the first and second electrodes are adjacent with each other, and further preferably spaced apart from each other. With this, electric current dispersion can be stimulated and the internal quantum efficiency can be improved. Moreover, the uniformity of electric current in the electrode forming surface can be improved and emission light with reduced color irregularity can be obtained. Specifically, as shown in FIG. 2 and FIG. 3, the n-type electrode 21 and the p-type electrode 22 disposed interposing the light emitting layer 13 are arranged with the central axes thereof not collinear with each other so that they don't overlap with each other in plan view seen from the light extracting surface side. That is, the p-type electrodes 22 are formed beneath the second region 32 shown in FIG. 1 and a protective film 7 is stacked in the regions between adjacent p-type electrodes 22 to insulate the electrodes.

Further, each of the electrode extending portions 30 has an electrode pad portion which is an external connection region 16 capable of connecting to outside. In other words, each of the electrode extending portions 30 is arranged extending from its electrode pad portion 16. In the case shown in FIG. 1, the electrode pad portion 16 is arranged near one of the end edges of the linear shaped electrode extending portion 30. Further, the pair of electrode pad portions 16 is arranged in an offset manner with respect to the longitudinal direction and/or shorter direction of the electrode forming surface 15, and the electrode pad portions 16 shown in FIG. 1 are arranged substantially symmetrical with respect to the center C of the electrode forming surface 15. That is, the pair of electrode pad portions is formed diagonally to each other with respect to the two directions parallel to the four sides consisting the rectangular shape of the electrode forming surface 15.

The electrode pad portions 16 are respectively connected with a conductive member such as a bonding wire, and the electric current from an external power supply is supplied to the element through the conductive member. Consequently, portions in the vicinity centering the electrode pad portions 16 have high electric current density. On the other hand, the regions of the electrode extending portions 30 including the electrode pad portions 16 cover the light emitting region 29, so that the amount of extracted light from the portions directly above the electrode extending portions 30 decreases. That is, by arranging the electrode pad portions 16 in an offset manner, localizing of the current crowding regions and light blocking regions in the electrode forming surface 15 can be prevented, which enables to obtain a light emitting element in which overall uniformity of electric current density is improved, and which is capable of emitting light with high directivity. In addition, in the example shown in FIG. 1, each of the electrode extending portions 30 is provided with an electrode pad portion 16, but a plurality of the electrode pad portions 16 may be provided on a single electrode extending portion 30 or on the electrode forming surface 15. For example, the electrode pad portion 16 can be provided in a linear shape or in a two dimensional shape such as a zigzag shape on the electrode forming surface 15, so that it functions in the same manner as the electrode extending portion.

The semiconductor structure 10 having the light emitting layer 13 may be any semiconductor structure formed according to any known methods and structures in the art. FIG. 5 through FIG. 9 respectively show a cross-sectional view of the light emitting element 1 including the semiconductor structure 10 and illustrate an example of the method of forming the light emitting element 1. A method of manufacturing a nitride semiconductor element which is an example of the light emitting element 1 of the present embodiment and each of the members thereof will be described in detail below with reference to FIG. 5 to FIG. 9.

(Semiconductor Structure)

Figure 5:
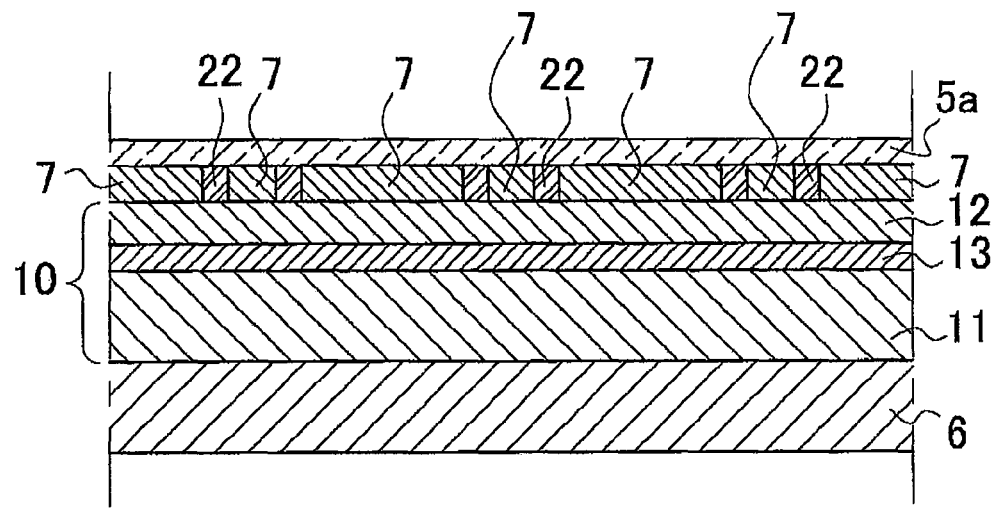
FIG. 5 is an explanatory view illustrating a method of manufacturing a light emitting element according to an embodiment.

Firstly, as shown in FIG. 5, a semiconductor structure 10 having a second conductive-type layer 12, a light emitting layer 13, and a first conductive-type layer 11 is formed on the growth substrate 6. The size and thickness and the like of the growth substrate 6 are not specifically limited, except that the substrate allows epitaxial growth of a nitride semiconductor, which is the semiconductor structure 10. Examples of growth substrate include an insulating substrate such as sapphire having a main surface of one of C-plane, R-plane, and A-plane, and a spinel ($MgAl_2O_4$), silicon carbide (6H, 4H, 3C), silicon, ZnS, ZnO, Si, GaAs. In addition, a nitride semiconductor substrate such as GaN and AlN can be used.

The semiconductor structure of the present invention is not limited to that described above and various light emitting structures such as a p-n junction, a p-i-n structure, a MIS structure can be employed. In the following, a nitride semiconductor will be illustrated as the semiconductor structure and the semiconductor a layer, but the present invention is not limited thereto and can also be applied to a light emitting element of other materials and wavelengths such as of GaAs-system and of InP-system, for example, InGaAs, a GaP semiconductor.

As the semiconductor structure, an n-type nitride semiconductor layer 11, a light emitting layer 13, and a p-type nitride semiconductor layer 12 are stacked in this order on a growth substrate 6. An underlayer such as a low temperature grown buffer layer such as $Al_xGa_{1-x}N$ ($0 \leq X \leq 1$) with a thickness of 1 to 3 nm or a high temperature growth layer such as $Al_xGa_{1-x}N$ ($0 \leq X < 1$) with a thickness of 0.5 to 4 μm may be provided between the semiconductor structure and the growth substrate, depending on the material of the growth substrate 6. For the n-type and p-type nitride semiconductor layers, there may be employed, for example, a layer represented by a composition formula $Al_xGa_yIn_{1-x-y}N$ ($0 \leq x \leq 1$, $0 \leq y \leq 1$, $x+y \leq 1$), and other layers in which a part of group-III, and/or group-IV elements thereof is substituted with B or with P, As, Sb and the like. For example, the n-type layer 11 may be constituted by a GaN contact layer and/or a multi-layer structure of InGaN/GaN, and the p-type layer 12 may be constituted by a single layer or a multilayer structure of AlGaN, InGaN, and/or GaN. As described above, each functional layer (contact layer, cladding layer) can be made with one or more of a single layer or a multilayer structure with various compositions and dopant amounts. The semiconductor layer of each of the conductive types is made by using an appropriate dopant. For example, Mg, Si and the like are respectively used for a p-type and n-type nitride semiconductor layers. Each conductive type layer may partially have an insulating or semi-insulating region or layer, or a region or layer of opposite conductive type.

The light emitting layer 13, that is an active layer, used in the present invention has a quantum well structure including, for example, an well layer made of $Al_aIn_bGa_{1-a-b}N$ ($0 \leq a \leq 1$, $0 \leq b \leq 1$, $a+b \leq 1$), and a barrier layer made of $Al_cIn_dGa_{1-c-d}N$ ($0 \leq c \leq 1$, $0 \leq d \leq 1$, $c+d \leq 1$). The nitride semiconductor used for the active layer may be any of undoped, n-type impurity doped, and p-type impurity doped. An undoped or n-type impurity doped nitride semiconductor is preferably used so as to obtain a light emitting element having higher output power. When Al is included in a well layer, a wavelength shorter than 365 nm corresponding to the bandgap energy of GaN can be obtained. The wavelength of light emitted from the active layer is modulated in the vicinity of 360 nm to 650 nm, preferably 380 nm to 560 nm, according to the purpose and usage of the light emitting element.

InGaN is suitably used as the composition of the well layer to obtain a light in the region of visible light to near-ultraviolet light, and at this time, GaN or InGaN is suitable for the composition of the barrier layer. The film thickness of the well layer is preferably 1 nm or more and 30 nm or less and a single quantum well structure having a single well layer or a multiquantum well structure having a plurality of well layers with a barrier layer and the like interposing therebetween can be employed.

(Second Electrode)

Next, as shown in FIG. 5, the second electrode 22 made of Rh, Ag, Ni, Au, Ti, Al, Pt or the like is formed in a pattern on the surface of the second conductive-type layer 12. The second electrode 22 is at the light reflecting side, so that the second electrode 22 preferably has a reflecting structure, more specifically, a reflecting layer having a high reflectance, particularly at a side in contact with the second conductive type layer. Other structure, such as a multilayer structure stacked via a thin bonding layer capable of transmitting light, for example, a bonding layer/a reflecting layer stacked in this order, can also be employed. Examples of the second electrode 22 include Ag/Ni/Ti/Pt from the semiconductor structure 10 side. Moreover, it is preferable to form the second electrode 22, in top view, on substantially the entire region of the nitride semiconductor layer except the region on which the first electrode 21 to be formed so that the light emitting regions supplied with the current injection can be made larger. Also, in plan view, when the first and second electrode have a region interposing the active layer 13 and overlapping with each other, a light loss may occur due to absorption of light, so that it is better to dispose the first and second electrodes spaced apart from each other.

(Protective Film)

A protective film 7 may be provided to protect the peripheral portion etc. of the nitride semiconductor element. In a case where the protective film is provided on the second conductive type semiconductor layer 12, it is formed on a region exposed from the second electrode 22, and in the example shown in the figure, it is provided adjacent to or spaced apart from each other. It is not limited above, it may also be provided to cover a part of the second electrode 22. Using the protective film 7 as an insulating film, an electric connection is established from the second electrode selectively provided on the surface of the second conductive-type semiconductor layer to the semiconductor layer. Examples of the materials of the protective film include a single layer film or a multilayer film using an oxide film such as $SiO_2$, $Nb_2O_5$, $Al_2O_3$, $ZrO_2$, $TiO_2$ and the like and a nitride films such as AlN, SiN and the like. Further, the protective film 7 may be covered with a metal film having high reflectivity such as Al, Ag, Rh and the like. Further, as with $SiO_2$/Ti/Pt, a part of the multilayer structure of the second electrode may be provided at the bonding layer 5a side of the insulating film.

(Semiconductor Layer Side Bonding Layer)

Next, a semiconductor layer side bonding layer 5a is formed on the second electrode 22 to from an alloy during bonding. The semiconductor side bonding layer 5a is made of an alloy containing at least one selected from the group consisting of Au, Sn, Pd, and In. The semiconductor side bonding layer 5a preferably has a three-layer structure made of an adhesive layer, a barrier layer, and a eutectic layer. The adhesive layer contains at least one selected from the group consisting of Ni, Ti, RhO, W, Mo. The barrier layer contains at least one selected from the group consisting of Pt, Ti, Pd, TiN, W, Mo, WN, and Au. The eutectic layer contains at least one selected from the group consisting of Au, Sn, Pd, and In. In addition, the film thickness of the semiconductor side adhesive layer 41a is set to 5 µm or less. For example, Ti/Pt/Au/Sn/Au may be employed. In a case where a part of the multilayer structure of the second electrode is provided on the protective film, Pt/Au/Sn/Au may be employed while omitting the adhesive layer.

(Support Substrate)

Meanwhile, a support substrate 4 is prepared. Examples of the support substrate 4 include, a Si substrate which is mainly used, a semiconductor substrate made of GaAs, a metal member such as Cu, Ge, and Ni, and a conductive substrate made of such as a composite material of Cu—W. In addition, Cu—Mo, AlSiC, AlN, SiC, a composite of metal and ceramics such as Cu-diamond, and the like can also be used. For example, Cu—W, and Cu—Mo can be represented by the general formulas $Cu_XW_{100-X}$ ($0 \leq X \leq 30$), $Cu_XMo_{100-X}$ ($0 \leq X \leq 50$) respectively. The advantage of using Si is its lower cost and easier chip formation. The support substrate 4 preferably has a thickness of 50 to 500 µm. Heat dissipation can be improved by adjusting the film thickness of the support substrate 4 in this range. On the other hand, if a conductive substrate is used as the support substrate, electric power can be supplied from the substrate side and an element having high electrostatic withstand voltage and excellent heat dissipation properties can be obtained. The support substrate is generally made of an opaque material such as Si, Cu(Cu—W), and it is preferable to provide a structure in which a reflecting structure is provided between the support substrate and the semiconductor layer, for example to an electrode, or is provided within the semiconductor layer, so that excellent heat dissipation and light emitting properties can be obtained. A plating member may be applied on the nitride semiconductor layer by way of plating to form a support substrate or a bonding portion with the support substrate. It is not necessary to provide an element with a support substrate, and an element can be directly mounted on a mounting portion or on a base of a light emitting device, or a structure can be employed in which a metal member disposed by way of plating or the like is provided on the semiconductor layer.

A multilayer thin film, such as a distributed Bragg reflector: DBR or the like, in which materials of different refractivity are alternately stacked in a periodical manner, can be formed on an opposite side of the semiconductor layer opposing the light extracting side, for example on the upper surface or the lower surface of the support substrate 4 or on the above-described surface of the nitride semiconductor layer (in this embodiment, on the surface of the second conductive-type layer 12). The multilayer thin film may be constituted with, for example, a dielectric multi-film and a semiconductor of GaN/AlGaN, and formed in a semiconductor layer, on the surface thereof, and/or for example on a protective film or the like, as a single film or with an electrode for reflection to provide a reflecting structure.

(Bonding Step)

Figure 6:
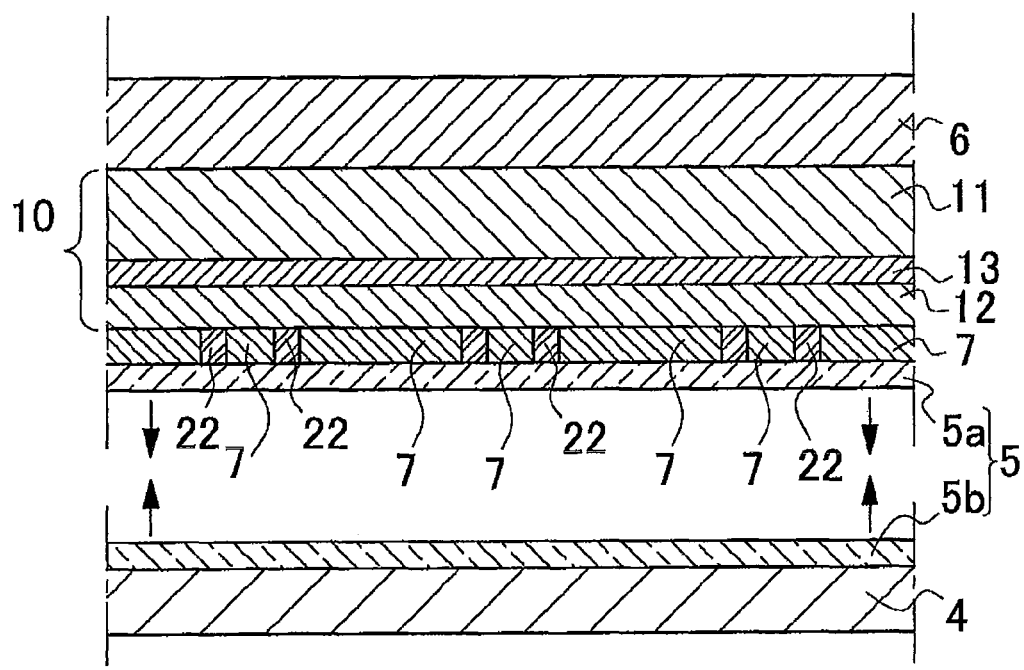
FIG. 6 is an explanatory view illustrating a method of manufacturing a light emitting element according to an embodiment.
Figure 7:
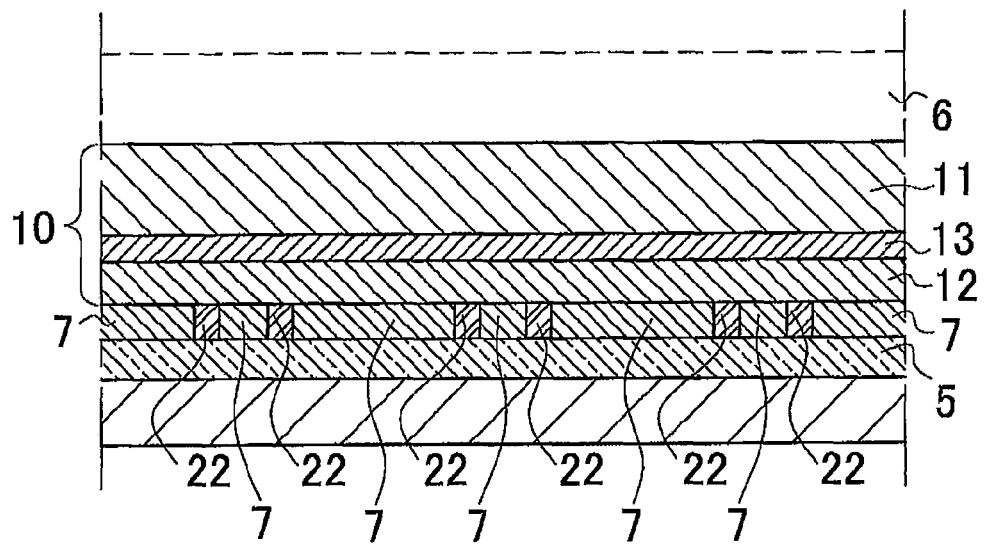
FIG. 7 is an explanatory view illustrating a method of manufacturing a light emitting element according to an embodiment.

Then, as shown in FIG. 6, the surface of the semiconductor layer side bonding layer 5a and the surface of the support substrate side bonding layer 5b are placed opposite each other and the support substrate 4 is bonded on the second electrode 22 of the nitride semiconductor layer side by way of thermal pressure bonding. The thermal pressure bonding may be performed by applying heat of 150° C. or higher during pressing. With this, as shown in FIG. 7, the semiconductor layer side and the support substrate side are bonded via the bonding layer 5 (5a and 5b).

A support substrate side bonding layer 5b is preferably formed on the surface of the support substrate 4. Also, a three-layer structure made of an adhesive layer, a barrier layer, and a eutectic layer is preferably employed for the support substrate side bonding layer 5b. The support substrate side bonding layer 5b is made of a metal film of, for example, Ti—Pt—Au, Ti—Pt—Sn, Ti—Pt—Pd or Ti—Pt—AuSn, W—Pt—Sn, RhO—Pt—Sn, RhO—Pt—Au, RhO—Pt—(Au, Sn) and the like.

In order to form a eutectic during the bonding step, an adhesive layer, a barrier layer, and a eutectic layer are preferably provided on the respective bonding surface of the support substrate side and the nitride semiconductor side. The materials of the bonding layer and each of the layers are appropriately formed according to the material of the layer (the substrate or the semiconductor) on which these layers are to be provided. After the bonding, second electrode/Ti—Pt—AuSn—Pt—Ti/support substrate is obtained. Other examples of the structure obtained by the bonding include, second electrode/RhO—Pt—AuSn—Pt—Ti/support substrate, second electrode/Ti—Pt—PdSn—Pt—Ti/support substrate, second electrode/Ti—Pt—AuSn—Pt—RhO/support substrate, second electrode/Ti—Pt—Au—AuSn—Pt—TiSi$_2$/support substrate, Ti/Pt/AuSn/PdSn/Pt/TiSi$_2$/support substrate, and Pt/AuSn/PdSn/Pt/TiSi$_2$/support substrate (when the protective layer is SiO$_2$/Ti/Pt). As described above, it is preferable that if the bonding surfaces of the support substrate side and the nitride semiconductor side include different metals, a eutectic can be obtained at a low temperature and the resulting melting point increases.

(Growth Substrate Removing Step)

Thereafter, as shown in FIG. 7, the growth substrate is removed (shown in dashed line) to expose the semiconductor structure 10. The growth substrate 6 is detached and removed by irradiating excimer laser beams (Laser Lift Off: LLO) on the growth substrate or removed by grinding. After removing the growth substrate 6, the exposed surface of the nitride semiconductor is subjected to CMP (chemical mechanical polishing) to expose a predetermined surface of the first conductive type layer 11. At this time, if the underlayer having high absorption with respect to light of the light emitting element, for example a high temperature growth GaN layer is removed or the thickness thereof is reduced, the effect of absorption can be reduced even in an LED having an emission wavelength in the ultraviolet range. With this processing, a damaged layer can be removed and the thickness of the nitride semiconductor layer can be adjusted, and the roughness of the surface can be adjusted.

(Dividing of Nitride Semiconductor Layer)

Figure 8:
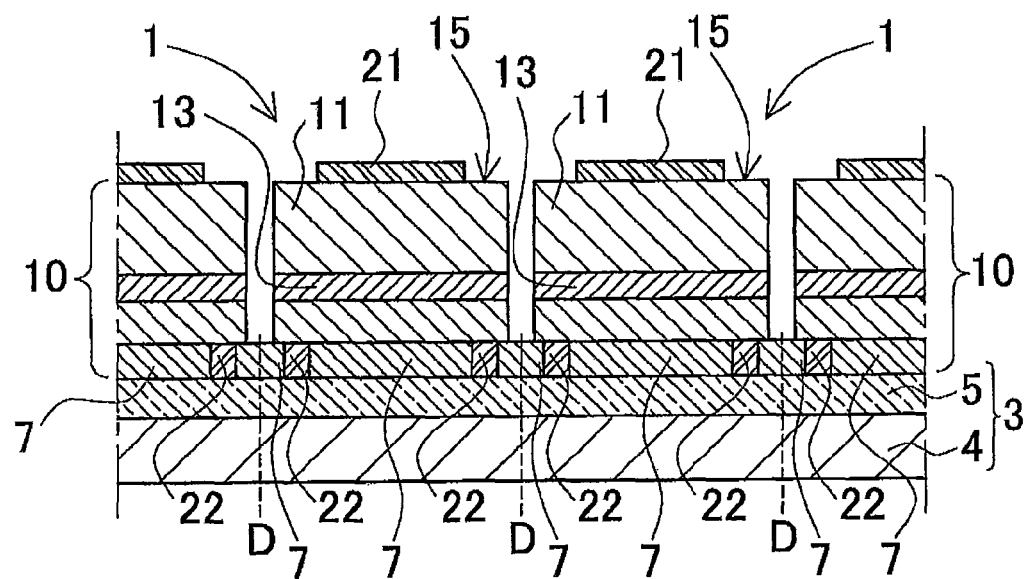
FIG. 8 is an explanatory view illustrating a method of manufacturing a light emitting element according to an embodiment.

Further, as shown in FIG. 8, the semiconductor structure 10 is divided into chips. Specifically, the circumference of the nitride semiconductor layer is removed by performing a peripheral etching using RIE or the like to expose the protective film 7 preliminary to dividing the nitride semiconductor element into chips.

An irregular structure may be provided on the light extracting surface such as the surface of the semiconductor layer to improve the light extracting efficiency. For example, an irregular structure may be formed on the exposed surface of the first conductive type nitride semiconductor layer by way of wet-etching, RIE and the like. An irregular structure may be provided on a transparent member covering the semiconductor layer, for example a protective film (not shown) on the surface of the first conductive type layer and the like, or an irregular structure may be provided across these materials or along the interfaces therebetween. An irregular structure may be provided on the light reflecting surface side such as the second electrode side. In this embodiment, an irregular structure is provided by wet etching using KOH to roughen a region of the surface of the semiconductor layer exposed from the first electrode.

(First Electrode)

Next, a first electrode 21 satisfying the structure described above is formed on the electrode forming surface 15 which is an exposed surface of the first conductive type layer 11. That is, in plan view from the electrode forming surface 15, the first electrode 21 is arranged off-position with respect to the forming region of the second electrode 22 positioned across from the active layer 13, so as not to have a region superimposed upon each other. This structure allows the carriers to travel in a region between the electrodes 21, 22 on the both sides having different central axes in the stacking-layer direction of the semiconductor structure 10 and facilitates the in-plane diffusion, and as a result, the internal quantum efficiency can be improved.

A structure used for the first electrode may be, in the stacked order, a Ti layer (first layer) for ohmic contact and adhesion with the first conductive layer and a pad layer (second layer) of gold, Al, or a platinum group metal for a pad, such as Ti—Au, Ti—Al or the like, or may be a structure in which a high melting point metal layer (W, Mo, or a platinum group metals) is provided as a barrier layer between the first layer for ohmic contact (for example W, Mo, Ti are preferable for ohmic contact with the first conductive layer) and the second layer for a pad. As a reflective electrode for the n-type nitride semiconductor, Al and/or an alloy thereof can be used, and as a transparent electrode, a conductive oxide such as ITO can be used. In the embodiment, in a case where an n-type electrode is provided in the first electrode 21, Ti—Al—Ni—Au, W—Al—W—Pt—Au, Al—Pt—Au, Ti—Pt—Au and the like, can be employed. The thickness of the first electrode may be 0.1 to 1.5 μm.

(Chip Dividing)

Next, dicing is carried out in the support pedestal 3 made of the support substrate 4 and the bonding layer 5 at dicing positions D in the boundary region of the nitride semiconductor element 1, to obtain the nitride semiconductor element 1 chips shown in FIG. 1 to FIG. 3.

(Transparent Conductive Layer)

A diffusion layer can be provided between each of the electrodes and the corresponding semiconductor layers to facilitate diffusion of the electric current. The diffusion layer is preferably such that it is provided over a large area with a width wider than that of each of the electrodes and exhibits a diffusing function, and is light transmissive so as not to impair the emission of light (at the second electrode side) and reflection of light (at the first electrode side), and for example, a transparent conductive layer can be employed. By forming a conductive layer in substantially the entire surface of the exposed semiconductor layer, the electric current can be evenly diffused in the entire semiconductor layer. The transparent conductive layer is, specifically, ITO, ZnO, In$_2$O$_3$, SnO$_2$, and the like, or a transparent conductive layer containing an oxide of Zn, In, or Sn is desirably formed, and preferably ITO is used. The transparent conductive layer may be made of a thin film, an oxide, or a nitride of a metal, which is a metal other than that described above, such as Ni, or a compound or composite material thereof.

(Wiring Structure)

In the nitride semiconductor element 1 shown in FIG. 1 through FIG. 4 respectively having a structure described above, in a case where the bonding layer 5 is of conductive and the support substrate 4 is a conductive substrate such as SiC, one of the main surfaces of the second electrode 22 can be made in contact with the second conductive type nitride semiconductor layer 12, and an external connection can be provided at the other main surface side of the second electrode 22. That is, one of the main surfaces (upper surface shown in FIG. 3) of the second electrode 22 is the surface to be in contact with the semiconductor, and the other main surface (lower surface) of the second electrode 22 can function as a surface for external connection. Further, the support substrate 4 to be bonded thereto is electrically connected to the second electrode 22, so that the back surface side (bottom surface side of the nitride semiconductor element 1 in FIG. 3) opposing the surface of the semiconductor stacked layer structure side can be an external connecting region of the second electrode 22. For example, through the electrode provided on the back surface of the support substrate 4, connection with an external circuit can be established. Also, in a case where the support substrate 4 is made of an insulating material, electric connection of the electrode can be established at the back surface side of the support substrate 4 by connecting the electrode of the support substrate 4 formed on the semiconductor stacked layer structure side and the electrode formed on the back surface which is the opposite side thereof, through a three dimensional wiring in the support substrate 4, a via hole for wiring, or the like. In any case described above, the second electrode 22 and an external electrode can be electrically connected without using an exposed wire. Further, greater heat dissipation effect can be obtained by connecting a separate heat dissipation member to the support substrate 4.

On the other hand, the first electrode 21 which is the electrode at the surface side of the semiconductor layer is connected to a conductive wire via solder and the like in the exposed region for connecting an external electrode. This configuration establishes an electric connection with an external electrode. Other configurations having a wiring structure on the semiconductor layer may be employed. For example, a structure may have a wiring layer provided from on the semiconductor layer to on an outside support substrate, and in this case, the connection to the outside is provided through such as the above described external connection of the support substrate and/or the wiring structure. In such a light emitting element and/or a device which does not use a wiring connection, a pad portion wider than the extending portion is not necessary, so that tendency for current crowding can be reduced and a phosphor layer to be described later and encapsulating member containing it can be suitably formed. For example, as in the example shown in FIG. 4, in a structure in which an electrode reaches an end portion of the semiconductor layer, the electrode can be extended on the support substrate which extends further outwardly.

In the nitride semiconductor element 1 shown in FIG. 1 to FIG. 3, a material having good electric conductivity is used for the support substrate 4, which enables to employ a vertically arranged electrode structure, in which the electrodes are disposed respectively at a portion above and a portion below the light emitting layer. Thus, electric current can be diffused into the entire surface of the p-type semiconductor layer (second conductive-type nitride semiconductor layer 12), and uniform in-plane diffusion of the electric current can be obtained. That is, electric resistance can be reduced and carrier injection efficiency can be improved. Further, the support substrate 4 can also serve as a heat dissipation substrate, so that deterioration of the properties of the elements due to generated heat can be prevented.

(Light Emitting Device)

Figure 9:
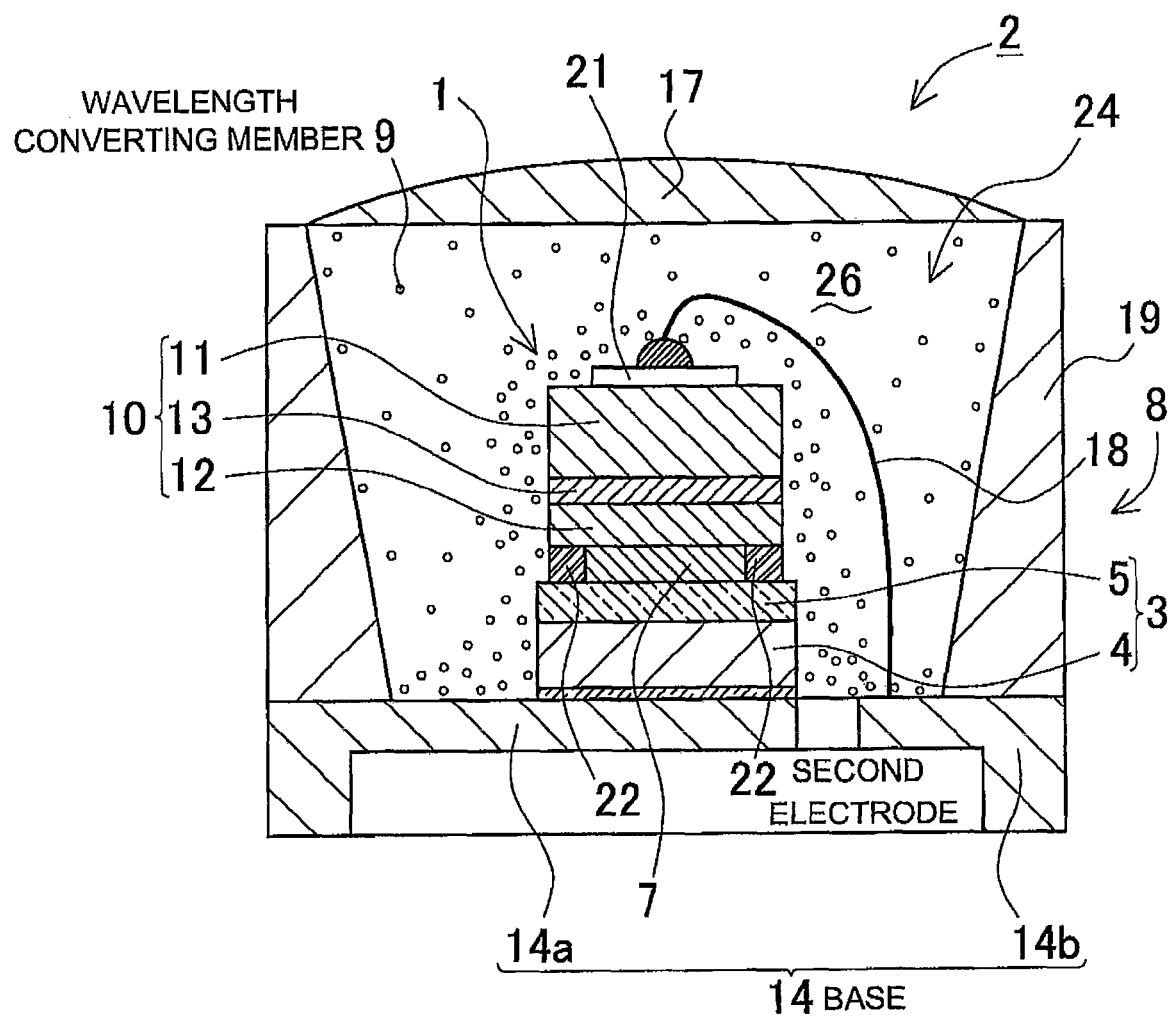
FIG. 9 is a schematic cross-sectional view of a light emitting device according to an embodiment.

A schematic cross sectional view of a light emitting device 2 shown in FIG. 9 exemplifies the nitride semiconductor element 1 shown in FIGS. 1 to 3 mounted in the package 8. The package 8 includes a base 14 having leads 14a and 14b respectively corresponding to a pair of electrode patterns. In the nitride semiconductor element 1 mounted on the base 14, the second electrode 22 for external connection formed at the mounting surface side of the support substrate 4 is electrically connected with one of the leads 14a of the base 14 through a conductive bonding member and the like. The first electrode 21 provided at the first conductive type layer 11 side of the nitride semiconductor element 1 is electrically connected to the other lead 14b via the conductive wire 18 at its external connection region 16 (see FIG. 1). In the figure, the light emitting element is mounted on the bottom surface of a recess, but the shape of the mounting portion is not limited thereto, and various configurations such as a flat shape, an upper surface of a protrusion or the like, can be employed.

(Lens)

An substantially recess-shaped cup 19 defined by a side surface, which in turn defines an upwardly widening aperture 24, is provided in the package 8. Further, a lens 17 such as a spherical lens, a nonspherical lens, a cylindrical lens, or an elliptical lens is provided to close the upper end of the aperture 24 of the package 8. Further, the surface of the light extraction side of the lens 17 may have a flat shape, and other than that, a process may be applied to obtain a lens-shape or a micro lens shape with an irregularity such as microlenses. A lens capable of diffusing or concentrating light emitted from a light source according to intended use can be provided, and the lens can be made of an inorganic glass, a resin, or the like.

Inner side of the aperture 24 is filled with an element covering member 26 which covers the nitride semiconductor element 1. A material having transparent property such as a silicone resin and a modified silicone composition is preferably used as well as a gaseous material for the element covering member 26. Also, an insulating resin composition having transparent property such as an epoxy resin composition, a modified epoxy resin composition, or an acrylic resin composition can be used. Further, a resin having excellent weather resistance such as a silicone resin, an epoxy resin, a urea resin, a fluororesin, and a hybrid resin containing at least one of those resins can also be used. Also, it is not limited to an organic substance, and an inorganic substance having excellent light stability such as a glass, a silica gel, and the like can also be used. An inert gas, nitrogen, oxygen, argon, helium, or a mixture thereof, or dry air etc., can be used in hermetic sealing. Particularly, in a case where a nitride gallium-based semiconductor element is used, dry air or a gas which contains at least oxygen is used to prevent deterioration of the semiconductor element.

(Mounted Element, Protective Element)

In the light emitting devices according to the present invention, a single nitride semiconductor element may be mounted, but two or more light emitting elements may be mounted, or a light emitting element may be mounted in combination with a protective element such as Zener diode, a capacitor. A protective element may be formed in a part of a light emitting element. Any known protective elements in the art can be employed.

(Wavelength Converting Member)

A wavelength converting member 9 such as a fluorescent material capable of emitting fluorescent light when excited by the emission from the light emitting layer 13 may be mixed in the element covering member 26. With this configuration, light from the light source can be converted to light having a different wavelength, and light of a mixed color of light from the light source and wavelength converted light from the wavelength converting member 9 can be extracted outside. That is, a part of light from the light source excites the phosphor, so that light having different wavelength than the wavelength of the main light source can be obtained. A phosphor can be suitably used as the wavelength converting member 9. This is because a phosphor also has light scattering and light reflecting functions, it can also serve as a light scattering portion in addition to its wavelength converting function, so that the effect of diffusing light described above can be obtained. The phosphor can be mixed in the element covering member 26 at an substantially uniform rate, or can be contained locally.

For example, deterioration of a fluorescent material can be suppressed by spacing apart from the light emitting layer 13 at a predetermined distance so that heat generated in the semiconductor layer is difficult to be transmitted to the fluorescent material. On the other hand, if the wavelength converting member 9 is placed close to the semiconductor layer side and an substantially uniform wavelength converting layer is formed, the amount of converted light of the emission from the light emitting layer can be made constant, so that the emission color having stable mixing ratio of the primary light and the converted light can be obtained.

One kind or two or more kinds of phosphors may be contained in a single layer element covering member 26 or one kind or two or more kinds of phosphors may be contained respectively in each layer of the light emitting layer made of a plurality of layers. With this configuration, a light emitting device capable of emitting a desired wavelength can be realized.

Typical phosphors include zinc cadmium sulfide activated with copper, YAG-based phosphors and LAG-based phosphors activated with cerium. Particularly, in the case of use at a high luminance for a long period of time, $(Re_{1-x}Sm_x)_3(Al_{1-y}Ga_y)_5O_{12}$:Ce ($0 \leqq x \leqq 1$, $0 \leqq y \leqq 1$, in which Re is at least one element selected from a group consisting of Y, Gd, La, and Lu) etc. is preferable. A YAG or LAG phosphor may be used as the wavelength converting member in Embodiment 2 and for example a white color can be obtained. A phosphor glass or a phosphor containing resin in which a phosphor is mixed into a glass or resin, or a phosphor or a crystalline body (plate) containing the phosphor may be used for the phosphor.

A lighting or an incandescent lamp color LED with high general color rendering index Ra is possible to realize by increasing a red component with a nitride phosphor or the like having yellow to red emission. Specifically, adjusting the amount of phosphors having different chromaticity points on the CIE chromaticity diagram according to the light emission wavelength of the light emitting element enables to provide light emission of a desired point in the area between the points representing the phosphors and the light emitting element on the chromaticity diagram. Other than the above, a nitride phosphor, an oxynitride phosphor, a silicate phosphor, $L_2SiO_4$:Eu (L represents an alkaline earth metal), and particularly $(Sr_xMae_{1-x})_2SiO_4$:Eu (Mae represents an alkaline earth metal such as Ca or Ba) which are capable of converting light of near ultraviolet to visible light range to yellow to red range can be employed. Examples of nitride based phosphors and oxynitride phosphors include Sr—Ca—Si—N:Eu, Ca—Si—N:Eu, Sr—Si—N:Eu, Sr—Ca—Si—O—N:Eu, Ca—Si—O—N:Eu, and Sr—Si—O—N:Eu. Examples of alkaline earth silicon nitride phosphors include those represented by general formula $LSi_2O_2N_2$:Eu, general formula $L_xSi_yN_{(2/3x+4/3y)}$:Eu or $L_xSi_yO_zN_{(2/3x+4/3y-2/3z)}$:Eu (L is Sr, Ca, or Sr and Ca).

(Additive Member)

The element covering member 26 may include an appropriate member according to the intended usage such as a pigment, a fluorescent material, or the like, as well as the wavelength converting member 9, and thus a light emitting element having good directional characteristics can be obtained. Similarly, various coloring agents may be added as a filter material having a filter effect that eliminates incident external light and unnecessary wavelengths from the light emitting element. In the present specification, a diffusion agent, for example having a center diameter of 1 nm or more and less than 5 μm, is capable of preferably diffusely reflecting light from a light emitting element and a fluorescent material, so that unevenness in color due to a fluorescent material of large particle size can be controlled and the half bandwidth of emission spectrum can be reduced. On the other hand, a diffusion agent of 1 nm or more and less than 1 μm is capable of increasing the viscosity of the resin without reducing the luminous intensity.

(Filler)

Further, other than a fluorescent material, a filler may be included in the element covering member 26. Specifically, a similar material as used for the diffusion agent can be used, but for the filler, a different center particle size than the diffusion agent may be used, and in the present specification, the center particle size of a filler is preferably 5 μm or more and 100 μm or less. In a case where a filler of such a particle size is included in the element covering member 26, chromatic irregularity of the devices can be improved due to the light scattering function thereof, and thermal shock resistance of the element covering member 26 can also be improved. With this configuration, occurrence of cracks and detachments at the interfaces between the light emitting element and other members can be prevented even in use under high temperature. Further, fluidity of the resin becomes possible to maintain constantly for long period of time.

Example 1

Figure 10:
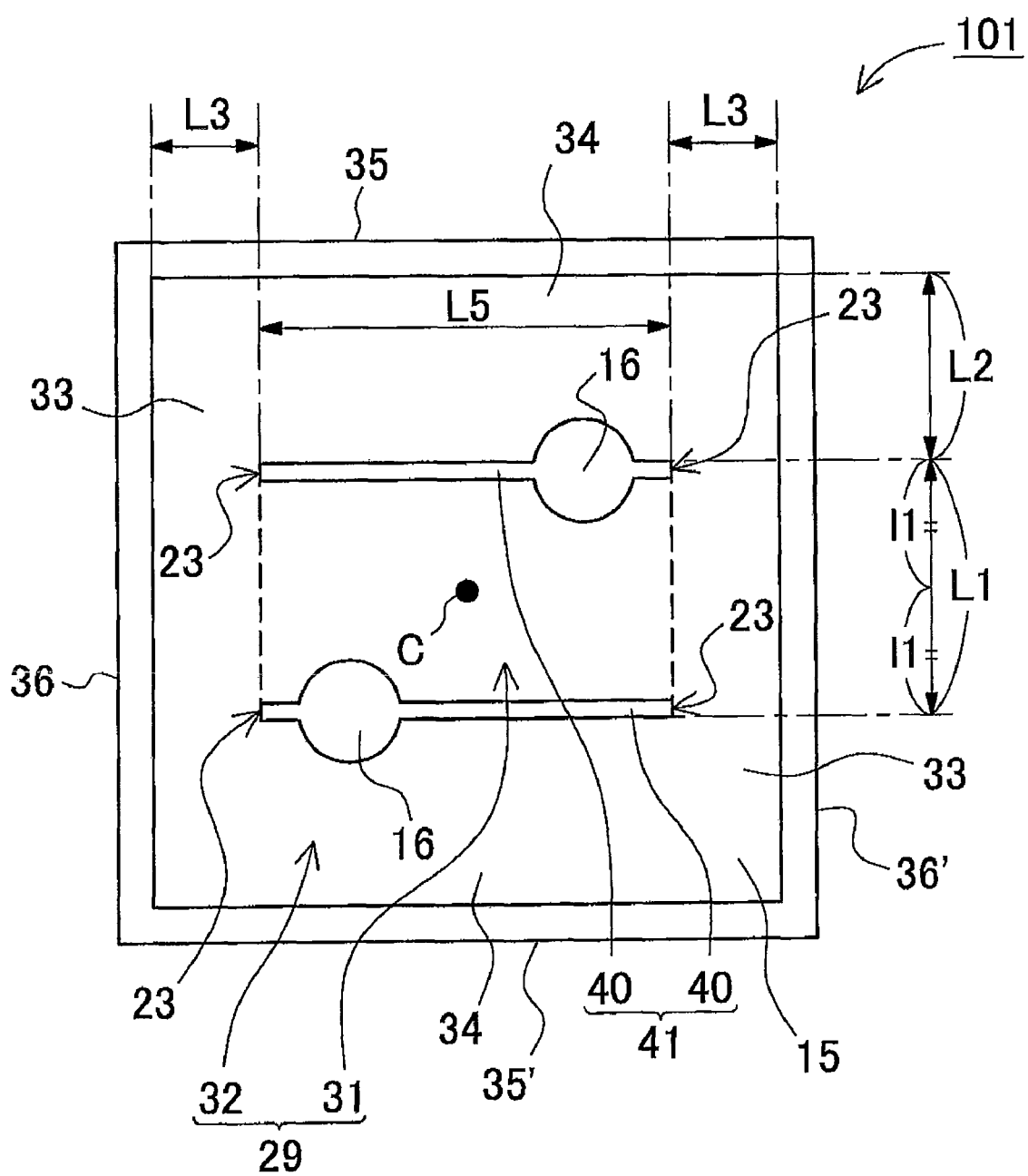
FIG. 10 is a plan view of a light emitting element according to Example 1.

A configuration of an electrode according to Example 1 will be shown below. Herein, members of the same quality as described above are assigned the same reference numerals and detailed description thereof will be omitted. FIG. 10 is a plan view of a light emitting element 101 seen from its light extracting side, and is mainly illustrating an n-electrode 41. The light emitting element 101 shown in FIG. 10 is a dice having an substantially square shape of □ 1 mm (electrode forming surface of 1 mm×1 mm). The circumferential shape thereof is formed by a first end 35 extending in one direction (the right and left direction in FIG. 10), a second end 36 perpendicular to the first end, and two ends 35', 36' positioned respectively opposite to and in parallel with the two ends 35, 36.

The n-electrode 41 has a pair of electrode pad portions 16 formed in the electrode forming surface 15 which is an exposed portion of the n-type semiconductor layer 11, and an electrode extending portion 40 linearly extending from each of the electrode pad portions 16. As shown in FIG. 10, the electrode forming surface 15 which is the electrode forming region is provided on an inner side substantially at a constant separation distance from the periphery of the rectangular periphery of the light emitting element 101. In Example 1, the region is at a separation distance of 30 μm from the periphery of the light emitting element 101, that is, the region has a shape reduced in size toward the center.

Moreover, the pair of electrode extending portions 40 are substantially in parallel with each other and are spaced apart from and disposed opposite each other. In FIG. 10, the extending direction of the electrode extending portions 40 is positioned respectively in parallel with the first side 35 and the electrode extending portions 40 are arranged in point symmetry with the center C of the electrode forming surface 15.

The electrode forming surface 15 is made of a first region interposed between a pair of electrode extending portions 40 and a region excluding the first region 31, that is, a second region 32 positioned surrounding the first region 31. In Example 1, in the direction parallel to the second side 36, the width of the first region 31 that is the separation distance (L1) between the electrode extending portion 40 is 400 μm and the width of each second region 32 that is the separation distance (L2) from an electrode extending portion 30 to corresponding end edge of the electrode forming surface 15 is 260 μm, and in the direction parallel to the first side 35, the width (L3) of the second region that is the separation distance between an end edge 23 of the electrode extending portion 40 and corresponding end edge of the electrode forming surface 15 is 165 μm.

According to the electrode structure of Example 1, an electrode extending portion 40 does not have a curved portion having a single or a plurality of bends in a stepwise manner, a branch portion, and/or an intersection portion, and a pair of linear-shaped electrode extending portions 40 is arranged spaced apart with each other. As a result, the n-type electrode 41 does not form a region closed by the electrode extending portion 40, that is, the n-type electrode 41 has an opening so that heat generated near the electrodes and in the first region 31 can be dissipated with high efficiency. Further, the longitudinal length (L5) of the electrode extending portion 40 is made larger than the separation distance (L1) between both electrode extending portions 40, so that the forming region of the electrode extending portion 40 in the electrode forming surface 15 can be increased without having an intersection. Therefore, light emission from the light emitting region 29 can be obtained uniformly while avoiding constriction of electrode current. The separation distance (L1) of the extended electrode portion 40 can be appropriately adjusted according to the degree of in-plane diffusion, that is the sheet resistance or the like, of the layer to which it is formed. Accordingly, a light emitting element in which a desired electric current diffusion body is realized can be obtained. Characteristics achieved by mounting a light emitting element of Example 1 on various types of light emitting devices will be described below.

(Lamp Type I)

A light emitting element of Example 1 is mounted on the lead for mounting which is one of two leads for each polarity, and the lead is encapsulated with a resin, and thus a lamp-type light emitting device of resin-lens simultaneously-encapsulated type is formed. Characteristics of a blue light emitting device thus obtained will be described below. At a drive current If: 350 (mA), Vf: 3.8 (V), optical output: 548.7 (mW), $\lambda_d$: 445.4 (nm), $\lambda_p$: 438.7 (nm), external quantum efficiency: 55.5(%), and power efficiency: 41.3(%).

(Lamp Type II)

Each characteristic described below is of a white light emitting device obtained by further applying a pre-coat of a resin containing a YAG phosphor in the cap of the above described mount lead in which the element has been mounted. At a drive current If: 350 (mA), Vf: 3.8 (V), color temperature Tcp: 5751 (K), color coordinates (x: 0.327, y: 0.333), and luminous efficiency: 79.5 (lm/W).

(Simultaneously-Encapsulated Type)

Characteristics shown below are of a blue light emitting device obtained by mounting the light emitting element of Example 1 in a cup of lead for mounting which is of one of the sets of the leads for each polarity, where a set is made of two leads (4 leads in total), and simultaneously encapsulating it with a resin-lens. At a drive current If: 350 (mA), Vf: 3.7 (V), optical output: 603.6 (mW), $\lambda_d$: 445.3 (nm), $\lambda_p$: 438 (nm), external quantum efficiency: 60.9(%), and power efficiency: 46.6(%).

Example 2

A light emitting element having a structure as that of the light emitting element of Example 1 is provided with the electrodes whose shape and arrangement are made in a scaled-down manner. With this light emitting element of □ 800 μm, good optical output and heat dissipation can be obtained as in Example 1.

Comparative Example 1

A planar view of the light emitting element 301 according to Comparative Example 1 is shown in FIG. 11. The light emitting element 301 shown in the figure is an substantially square dice of ±600 μm size, and has a substantially the same structure as in the light emitting element 101 of Example 1 except the size of the dice and the configuration of the electrodes. Therefore, members of the same quality as described above are assigned the same reference numerals and detailed description thereof will be omitted.

In the light emitting element 301 of FIG. 11, the n-type electrode 51, which is the first electrode, has an electrode extending portion 50 having the same shape as the electrode forming surface 15 but in a scaled down manner with respect to the center C of the electrode forming surface 15, that is, it has an substantially squarely closed shape. In other words, the corners of the electrode extending portion 50 have a curved portion bent at substantially right angle. An electrode pad portion which is an external connection region 16 is provided at one corner of the square shape. As shown in FIG. 11, the electrode extending portion 50 is disposed through the middle points M between the center C and respective end edges of the electrode forming surface 15 and also at an outer region with respect to the middle points M. That is, the electrode extending portion 50 is arranged closer to the end edges of the electrode forming surface 15.

Further, the light emitting element 301 has, as in Example 1, the first region 31 interposed between the electrode extending portions 50 and the second region 32 which is from the outer edge of the first region to the end edge of the electrode forming surface 15. In the light emitting element of Comparative Example 1, the first region 31 is a closed region surrounded by the electrode extending portions 50 and does not have an opening.

Comparative Example 2

Figure 12:
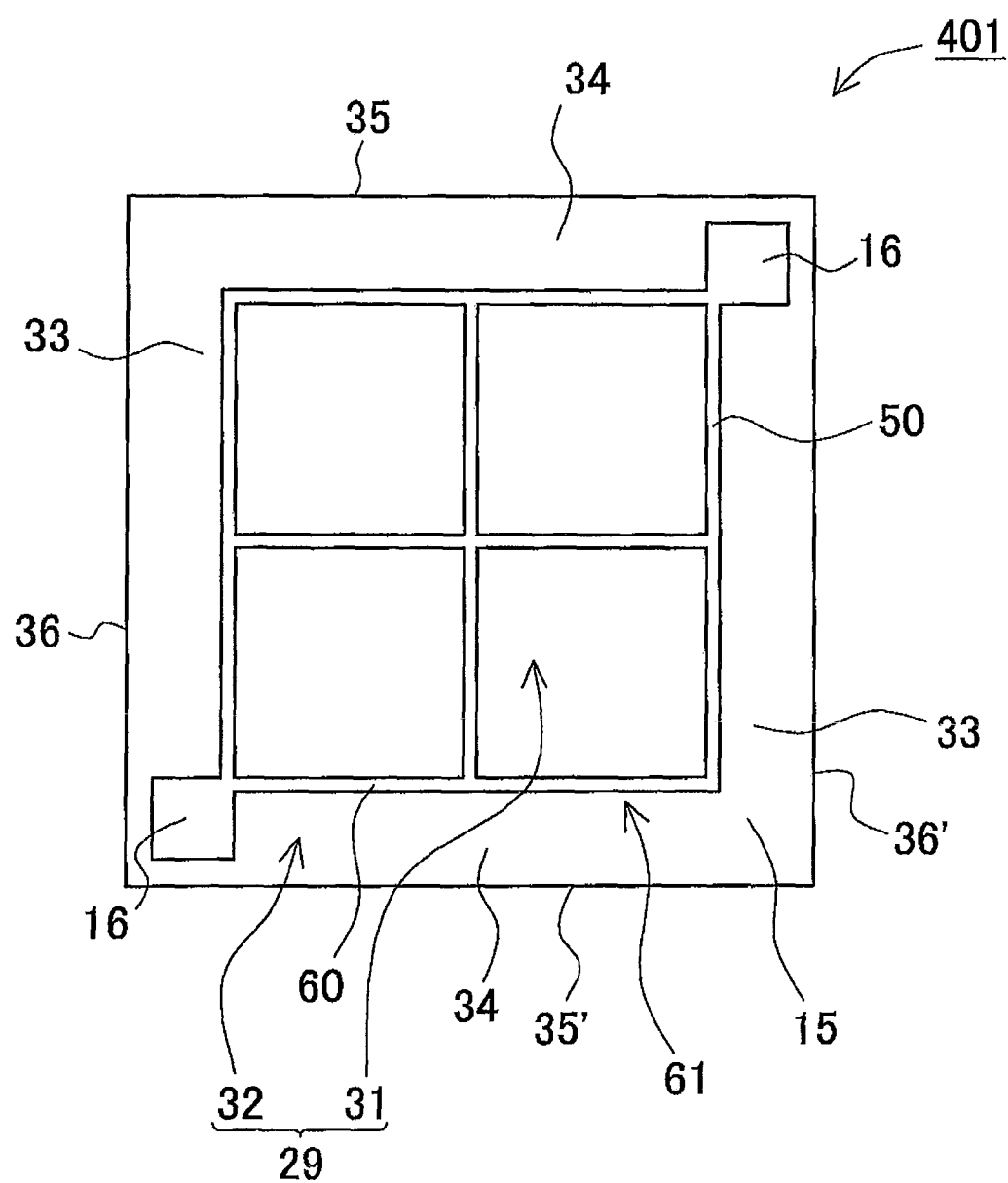
FIG. 12 is a plan view of a light emitting element according to Comparative Example 2.

A light emitting element having a different configuration of the electrodes is shown in FIG. 12 as Comparative Example 2.

The light emitting element 401 of FIG. 12 is an substantially square dice of □ 1 mm as in Example 1 and has a surrounding electrode structure as in Comparative Example 1. Herein, members of the same quality as described above are assigned the same reference numerals and detailed description thereof will be omitted.

Figure 15:
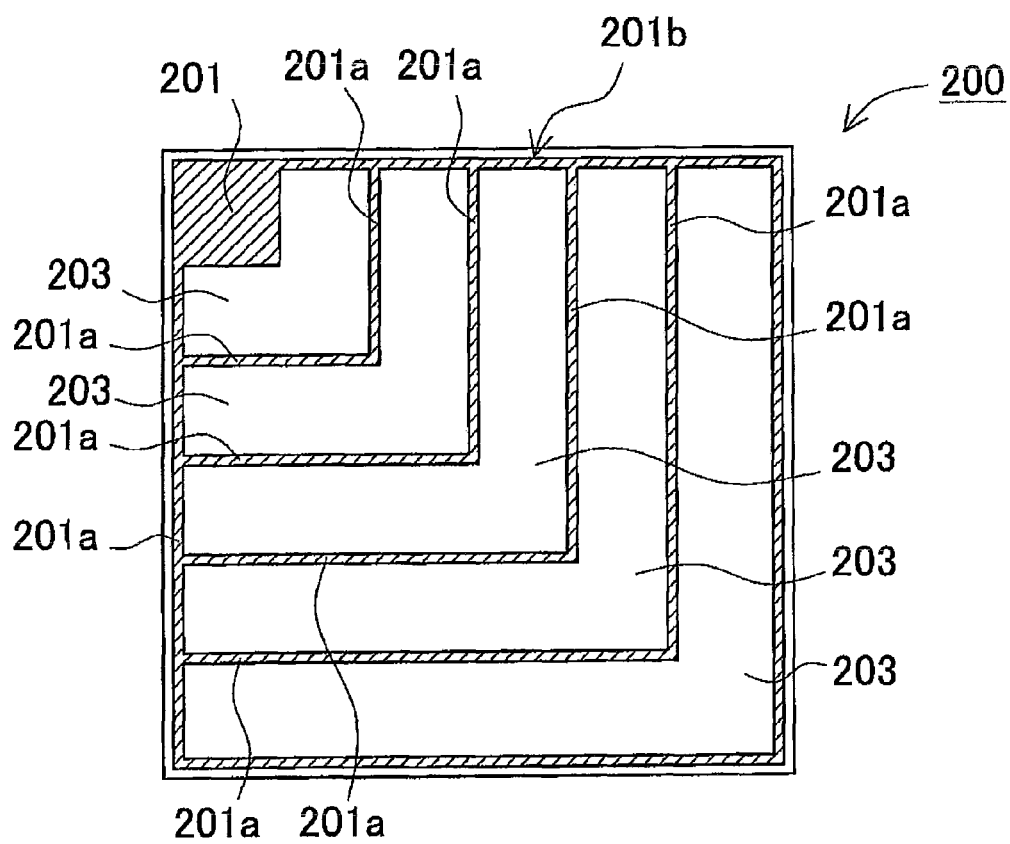
FIG. 15 is a plan view of a light emitting element according to another conventional embodiment.

In the light emitting element 401 of FIG. 12, the electrode pad portions, which are the external connection regions 16, are provided at a pair of opposite corners of the square-shaped electrode forming surface 15. The electrode extending portion 60 extended from the electrode pad portions 16 is arranged along the four sides of the periphery of the electrode forming surface 15 to form a surrounding electrode of a closed rectangular shape. Further, the electrode extending portion 60 is extended to connect the centers of opposite sides of the rectangular shape, that is, it divides the rectangular-shape into four substantially equal parts. That is, the n-type electrode which is the first electrode 61 of Comparative Example 2 has bent portions and a crossing portion, and in this regard, is similar to the electrode structure in the conventional light emitting element shown in FIG. 15.

Figure 13:
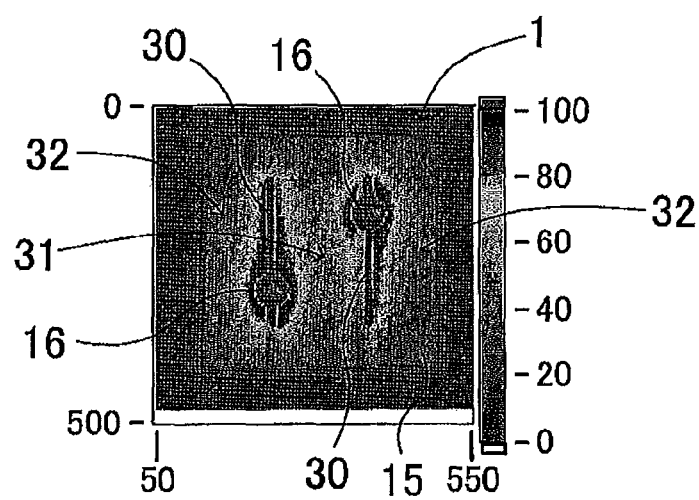
Figure 13:
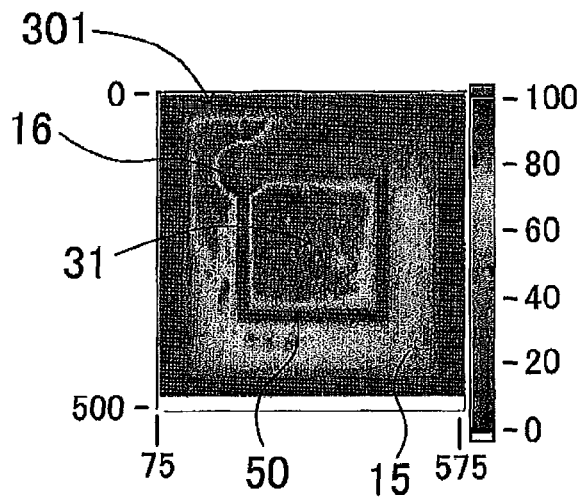
Figure 13:
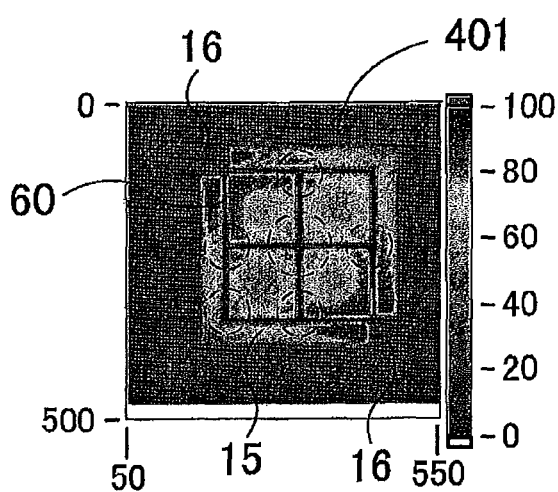
Figure 14:
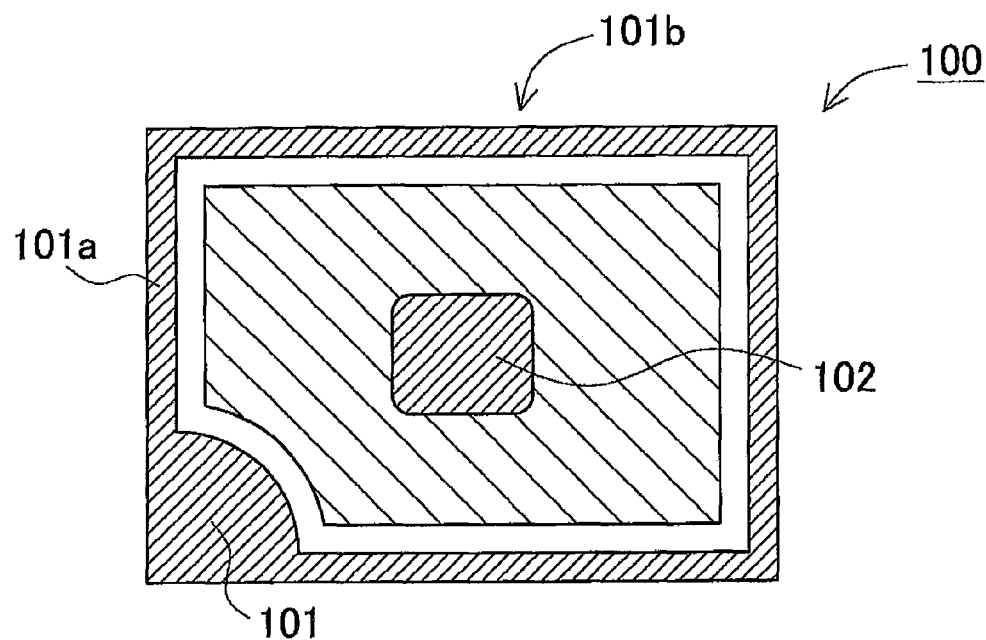
FIG. 14 is a plan view of a light emitting element according to a conventional embodiment.

FIGS. 13(*a*), 13(*b*), and 13(*c*) show relative emission intensity distribution diagrams of the light emitting elements 1, 301, and 401 of Example 1, Comparative Examples 1 and 2 respectively. In each emission distribution diagrams shown in gray scale, darker areas in the electrode forming surface 15 of the light emitting element denote higher emission intensity, and consequently indicate the areas where the temperature rises. A region of high emission intensity is observed in the vicinity of the pad-electrode portion 16 in any one of the light emitting elements 1, 301, and 401, shown in FIGS. 13(*a*), 13(*b*), and 13(*c*).

As shown in FIG. 13(*a*), the light emitting element 1 of Example 1 has a region of high emission intensity mainly around the pad electrode portion 16 and also in the vicinity of the electrode extending portion 30 which is extended linearly from the pad-electrode portion 16. With this, the temperature increases more in the above regions than other regions, but the heat dissipation effect is significant as described above, and therefore, the temperature rise is suppressed in the regions where the n-type electrode structure is not provided, namely in the first region 31 and the second region. Specific heat resistance of 6.52 to 7.67° C./W (a support substrate of Cu—W is made with a thickness of 10, 200, 300, or 400 μm respectively and mounted on a light emitting device having a ceramic base material, and measured).

On the other hand, as shown in FIG. 13(*b*), the light emitting element 301 of Comparative Example 1 has a surrounding electrode structure formed with the electrode extending portion 50, so that the emission concentrates in the first region 31 and the heat accumulation at that portion increases. Specifically, local current crowding is observed in the vicinity of the pad-electrode portion 16 and this tendency becomes more significant. As described above, not only the portion situated inner side of the rectangular shape made of the first electrode but also the portion situated outside of the pad-portion has the same tendency as of the inner side.

Similarly, as shown in FIG. 13(*c*), in the light emitting element 401 of Comparative Example 2, unevenness in current diffusion is also observed among the compartments. Particularly, as shown in the regions encircled in dashed line in the figure, current crowding occurs at an intersection of the electrode extending portion 60 even in a region relatively far from the pad-electrode portion 16. That is, local current crowding or unevenness of electric current is significant at the four corners (bent portions) of rectangular shapes which have been divided into smaller compartments.

The results shown above indicate that the light emitting element 1 of Example 1 has superior heat dissipating property and has high tolerance even under large current. In Comparative Example 1, as described above, even if the first region is sufficiently wide, large with respect to the width and area of the element, concentrated emission occurs inside and outside the region, which results in deterioration of in characteristics of the device. That is, in the electrode structure, by employing an configuration which does not include a bent and/or inter-section region in the electrode extending portion and which is capable of realizing current diffusion in the device at high efficiency, local current crowding can be prevented and heat dissipating properties can be improved, and at the same time, uneven distribution of current density within the electrode can be limited. That is, it thus allows to obtain a light emitting element capable of maintaining or improving the optical output while attaining current uniformity and emission uniformity.

INDUSTRIAL APPLICABILITY

The light emitting element and the light emitting device using the light emitting element according to the present invention can be suitably applied to light source for lighting applications, LED displays, LED displays, backlight light sources, signals, switches with light, various sensors and indicators, or the like.

What is claimed is:

1. A light emitting element comprising:
a semiconductor structure having a first conductive type layer and a second conductive type layer stacked interposing a light emitting layer therebetween; and
a first electrode and a second electrode opposite each other respectively electrically connected to the first conductive type layer and the second conductive type layer,
wherein the first electrode has a pair of electrode extending portions opposite each other formed on an electrode forming surface on the first conductive type layer positioned at the light extracting side, and
wherein in an opposing direction of the pair of electrode extending portions, a half distance along said opposing direction between the electrode extending portions is shorter than a distance along said opposing direction from the electrode extending portions to the end edge of the electrode forming surface.

2. The light emitting element according to claim 1, wherein in the opposing direction of the pair of electrode extending portions, the distance from the electrode extending portions to the end edge of the electrode forming surface is 1.2 times or more and 1.5 times or less than the half distance between the pair of electrode extending portions.

3. The light emitting element according to claim 1, wherein in plan view from the light extracting side, the electrode extending portions are arranged substantially symmetrical with respect to the center of the electrode forming surface.

4. The light emitting element according to claim 1, wherein in plan view from the light extracting side, the electrode extending portions have a linear shape.

5. The light emitting element according to claim 1, wherein a first region arranged on the electrode forming surface and interposed between the electrode extending portions has an opening in the extending direction of the electrode extending portions.

6. The light emitting element according to claim 1, wherein the pair of electrode extending portions respectively has an external connection region electrically connectable with an external electrode on a part of the electrode extending portions, and the pair of external connection regions are arranged offset relative to each other in a longer direction or a shorter direction of the electrode forming surface.

7. The light emitting element according to claim 1, wherein in plan view from the light extracting side, the first electrode and the second electrode are arranged offset relative to each other, and the second electrode is formed in a second region positioned between the electrode extending portion of the first electrode and an end edge of the electrode forming surface.

8. The light emitting element according to claim 1, wherein
the electrode forming surface has a first region interposed between the electrode extending portions, and a second region positioned between the electrode extending portions and an end edge of the electrode forming surface, and
the second region positioned outside of the first region has a second right and left region arranged at the both end regions in the extending direction of the electrode extending portion and a second upper and lower region arranged at the both end region in the opposing direction of the electrode extending portion, and the width of the second right and left regions are 0.2 times or more and 0.8 times or less than the width of the second upper and lower region.

9. A light emitting device comprising:
a base having a first electrode pattern and a second electrode pattern; and
a single or plurality of light emitting elements mounted on the base and respectively electrically connected to the first electrode pattern and the second electrode pattern;
wherein the light emitting element is a light emitting element according to claim 1 and is covered with an element covering member.

10. The light emitting device according to claim 9, wherein a wavelength converting member capable of absorbing at least a part of emission from the light emitting element and converting the wavelength of the absorbed light is contained in the element covering member.

11. The light emitting device according to claim 9, wherein a light diffusing member capable of reflecting emission from the light emitting element is contained in the element covering member.

12. The light emitting element according to claim 1, wherein said opposing direction of the pair of electrode extending portions is a direction substantially perpendicular to the electrode extending portions.

* * * * *